United States Patent
Colbert et al.

(10) Patent No.: US 11,799,451 B2
(45) Date of Patent: Oct. 24, 2023

(54) MULTI-TUNE FILTER AND CONTROL THEREFOR

(71) Applicant: NETCOM INC., Wheeling, IL (US)

(72) Inventors: Kenneth Allen Colbert, Wheeling, IL (US); Vasileios Liaropoulos, Wheeling, IL (US)

(73) Assignee: NETCOM, INC., Wheeling, IL (US)

( * ) Notice: Subject to any disclaimer, the term of this patent is extended or adjusted under 35 U.S.C. 154(b) by 0 days.

(21) Appl. No.: 17/200,391

(22) Filed: Mar. 12, 2021

(65) Prior Publication Data
US 2021/0288631 A1    Sep. 16, 2021

Related U.S. Application Data

(60) Provisional application No. 63/059,753, filed on Jul. 31, 2020, provisional application No. 62/989,585, filed on Mar. 13, 2020.

(51) Int. Cl.
*H03H 11/04* (2006.01)
*H03K 5/1252* (2006.01)

(52) U.S. Cl.
CPC .......... *H03H 11/04* (2013.01); *H03K 5/1252* (2013.01)

(58) Field of Classification Search
CPC .............................. H03H 11/04; H03K 5/1252
See application file for complete search history.

(56) References Cited

U.S. PATENT DOCUMENTS

| | | | |
|---|---|---|---|
| 4,462,009 A | | 7/1984 | Landt et al. |
| 5,006,810 A | * | 4/1991 | Popescu ............. H03H 11/1217 327/552 |
| 6,064,259 A | * | 5/2000 | Takita ................ H03F 3/2173 330/10 |
| 6,512,472 B1 | * | 1/2003 | Smith ................ H03M 1/129 341/155 |
| 7,457,757 B1 | * | 11/2008 | McNeill ............. G10L 21/0208 704/500 |
| 7,804,760 B2 | * | 9/2010 | Schmukler ........... H03H 11/265 370/201 |
| 7,956,694 B1 | * | 6/2011 | Wilson ................ H05B 39/08 331/12 |
| 9,923,526 B1 | | 3/2018 | Lembeye |
| 2013/0344837 A1 | | 12/2013 | Rajkotia et al. |
| 2014/0035702 A1 | * | 2/2014 | Black ................ H03H 7/075 333/186 |
| 2019/0245522 A1 | | 8/2019 | Lu et al. |

FOREIGN PATENT DOCUMENTS

CN          203522670 U      4/2014

OTHER PUBLICATIONS

Search Report & Written Opinion issued in Appl. No. PCT/US2021/022184 (2021).

* cited by examiner

*Primary Examiner* — Tomi Skibinski

(74) *Attorney, Agent, or Firm* — BARNES & THORNBURG LLP

(57) ABSTRACT

A multi-tune filter system and a control system for operating the multi-tune filter system are described herein. The multi-tune filter system is a tunable frequency range filter. Further, the multi-tune filter system is a digitally programmable filter with an adjustable passband between first and second customizable frequency bounds f1, f2.

6 Claims, 33 Drawing Sheets

MULTI-TUNE FILTER AND CONTROL THEREFOR

CROSS-REFERENCE TO RELATED APPLICATION(S)

This application claims the benefit of U.S. Provisional Patent Application No. 62/989,585, filed Mar. 13, 2020, for "Multi-Tune Filter", and U.S. Provisional Patent Application No. 63/059,753, filed Jul. 31, 2020, for "Multi-Tune Filter and Control Therefor", the entire disclosures of which are hereby incorporated herein by reference.

TECHNICAL FIELD

The present subject matter relates to detecting of electromagnetic waves, and more particularly, to filtering of radio frequency (RF) signals.

BACKGROUND

Conventionally, tunable bandpass filters are tuned by adjustment of a center frequency only. As a result, a peak frequency may be adequately received by a typical tunable bandpass filter. However, performance decreases rapidly as frequencies move away from the selected center frequency. Alternatively, high pass and low pass filters attenuate frequencies below a set point or above a set point, respectively. The multi-tune filter described hereinbelow represents an improvement in the art.

The description provided in the background section should not be assumed to be prior art merely because it is mentioned in or associated with the background section. The background section may include information that describes one or more aspects of the subject technology.

SUMMARY

According to an aspect of this disclosure, a multi-tune filter system, includes first and second frequency bounds, and an adjustable passband with a selectable center frequency, such that the first and second frequency bounds are customizable within a range of 1.5 MHz to 30 Mhz, and the first and second frequency bounds of the passband are customizable about the selected center frequency.

The multi-tune filter system may be further configured such that the adjustable passband is defined by a combination of the selected center frequency and the first and second frequency bounds. The multi-tune filter system of may be further configured such that the center frequency and the first and second frequency bounds are addressable in 100 KHz increments. The multi-tune filter system may further include a customizable low pass filter section and a customizable high pass filter section. The multi-tune filter system may be further configured such that the customizable low pass filter section comprises first, second, and third digital low pass filter legs. The multi-tune filter system may be further configured such that the customizable high pass filter section comprises first, second, and third digital high pass filter legs. The multi-tune filter system may be further configured such that at least one of the first, second, and third digital low pass filter legs and at least one of the first, second, and third, digital high pass filter legs operate to define the adjustable passband filter in combination with the selected center frequency.

According to another aspect of the present disclosure, a method of controlling a multi-tune filter includes selecting a center frequency and defining the adjustable passband by determining first and second frequency bounds, such that the first and second frequency bounds and the center frequency are maintained to implement a tuned frequency range filter by controlling a plurality of impedance transformers and a plurality of radio frequency (RF) switches.

The method of controlling the multi-tune filter may be further implemented such that the first and second frequency bounds are digitally tunable.

The method of controlling the multi-tune filter may be further implemented such that the first and second frequency bounds correspond to a high pass filter leg and a low pass filter leg of the multi-tune filter.

The method of controlling the multi-tune filter may be further implemented such that the first and second frequency bounds result in a customized bandwidth for the center frequency disposed therebetween.

The method of controlling the multi-tune filter may be further implemented such that the first and second frequency bounds correspond to a plurality of impedances selected for each of the low pass leg and the high pass leg.

The method of controlling the multi-tune filter may be further implemented such that each of the high pass filter leg and the low pass filter leg comprise nine frequency subranges dependent upon the plurality of selected impedances.

According to yet another aspect of this disclosure, a multi-tune filter control system includes a first frequency limit at 1.5 MHz and a second frequency limit at 30 MHz, first and second frequency bounds selected within a frequency range defined by the first and second frequency limits, a center frequency customizable between the first and second frequency bounds, and an adjustable passband filter implemented between the first and second frequency limits, such that the first and second frequency bounds are customizable to develop a bandwidth of the adjustable passband filter and the bandwidth is customizable around the center frequency.

The multi-tune filter control system may be further configured such that the first frequency bound corresponds to a plurality of low pass filters and the second frequency bound corresponds to a plurality of high pass filters.

The multi-tune filter control system may be further configured such that a first digital control signal addresses the plurality of low pass filters and a second digital control signal addresses the plurality of low pass filters, and wherein the first and second digital control signals represent the selected first and second frequency bounds.

The multi-tune filter control system may be further configured such that one or more of the plurality of low pass filters and one or more of the plurality of high pass filters are selected to implement the adjustable passband filter having the first frequency bound, the second frequency bound, and the center frequency.

The multi-tune filter control system may be further configured such that selected one or more of the plurality of low pass filters and the selected one or more of the plurality of high pass filters operate simultaneously on a signal to produce a passband filtered signal.

The multi-tune filter control system may be further configured such that selected one or more of the plurality of low pass filters and the selected one or more of the plurality of high pass filters operate in a cascading manner on a signal to produce a passband filtered signal.

The multi-tune filter control system may be further configured such that the plurality of low pass filters and the plurality of high pass filters are digitally tunable in one or more combinations to implement a custom center frequency.

Other aspects and advantages of the present invention will become apparent upon consideration of the following detailed description and the attached drawings wherein like numerals designate like structures throughout the specification.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings:

FIG. 14 is a table illustrating a number of tunable combinations for the multi-tune filter system;

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

I. General Overview

Figure 1:
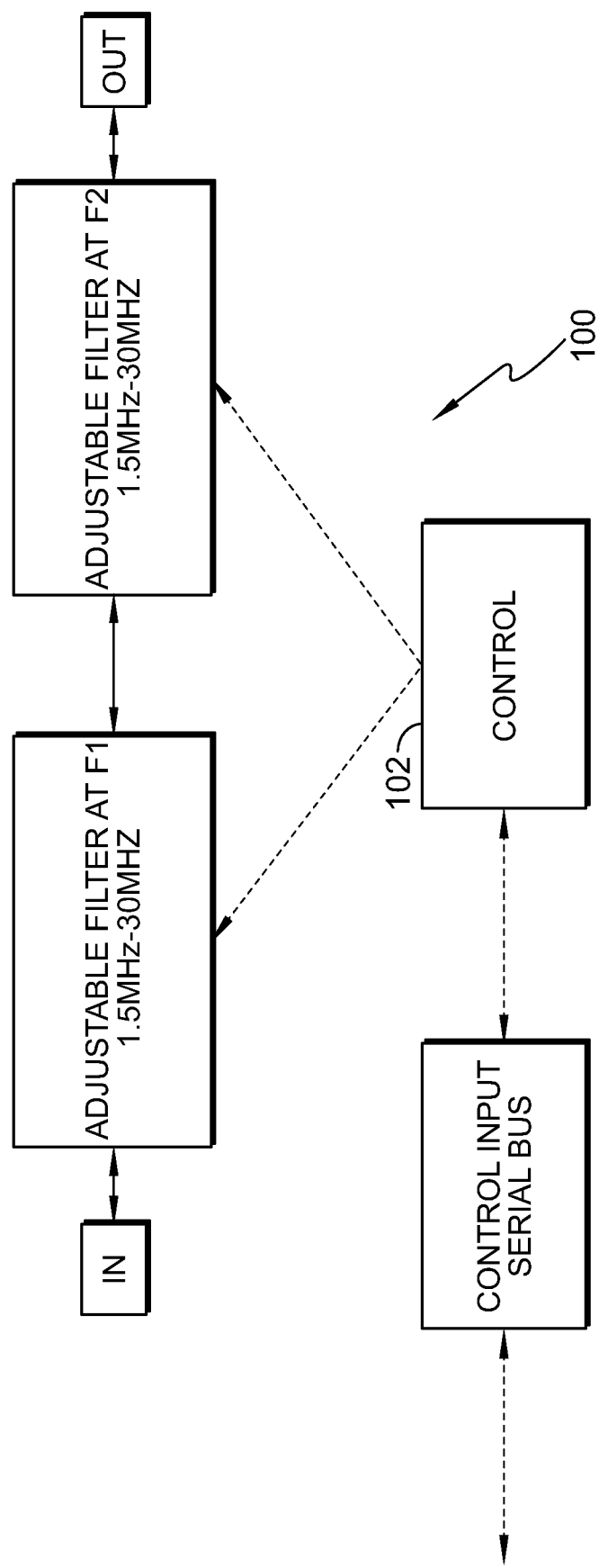
FIG. 1 is a block diagram of a multi-tune filter system and control therefor.
Figure 2:
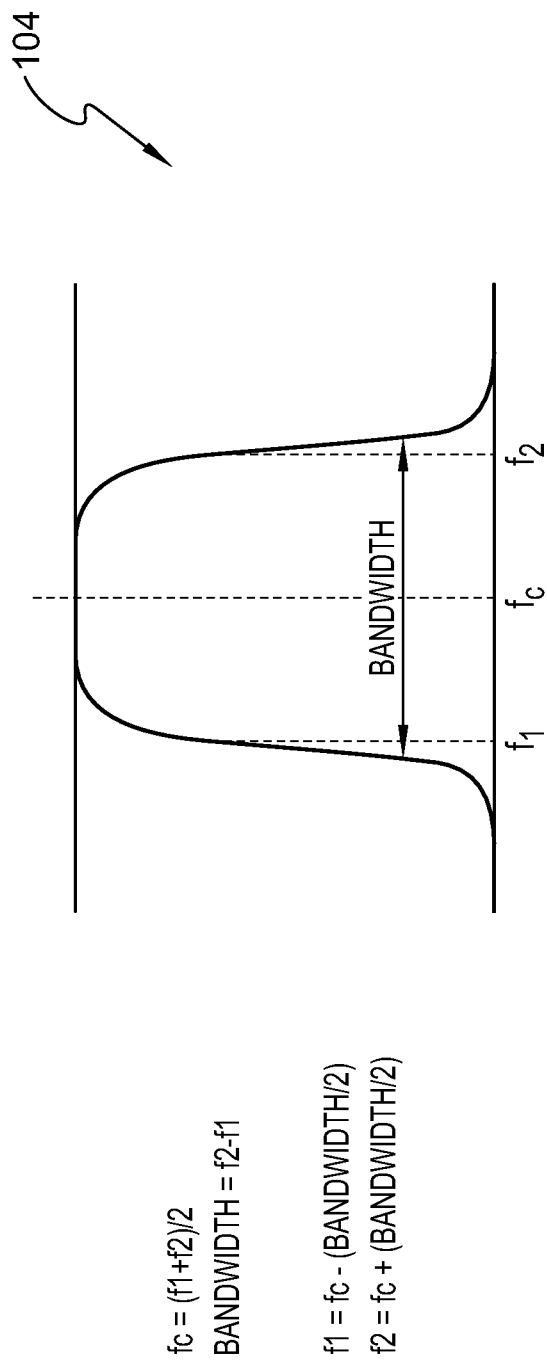
FIG. 2 graphically represents the tunable frequency range of the multi-tune filter of FIG. 1.

Generally, the present disclosure details, with reference to FIGS. 1-27, a multi-tune filter system 100 and a control system 102 for the multi-tune filter system 100. The multi-tune filter system 100 is a tunable frequency range filter, as illustrated in FIGS. 1 and 2. The multi-tune filter system 100 is contrasted with a conventional tunable bandpass filter, which only facilitates adjustment thereof by modifying a center frequency. The multi-tune filter system 100 is a digitally programmable filter with an adjustable passband 104 between first and second customizable frequency bounds f1, f2.

The first and second customizable frequency bounds f1, f2 are independently tuned to desired frequencies above and below a center frequency fc. The first and second customizable frequency bounds f1, f2 define the range limits of a tuned pass band/frequency range filter implemented by the multi-tune filter system 100. FIG. 2 graphically represents the tunable frequency range of the multi-tune filter of FIG. 1. The multi-tune filter system 100 forms a filter with a completely adjustable center frequency and bandwidth as directed by instructions from a user and/or programming elements.

II. Example Implementations

Apparatus

Figure 3:
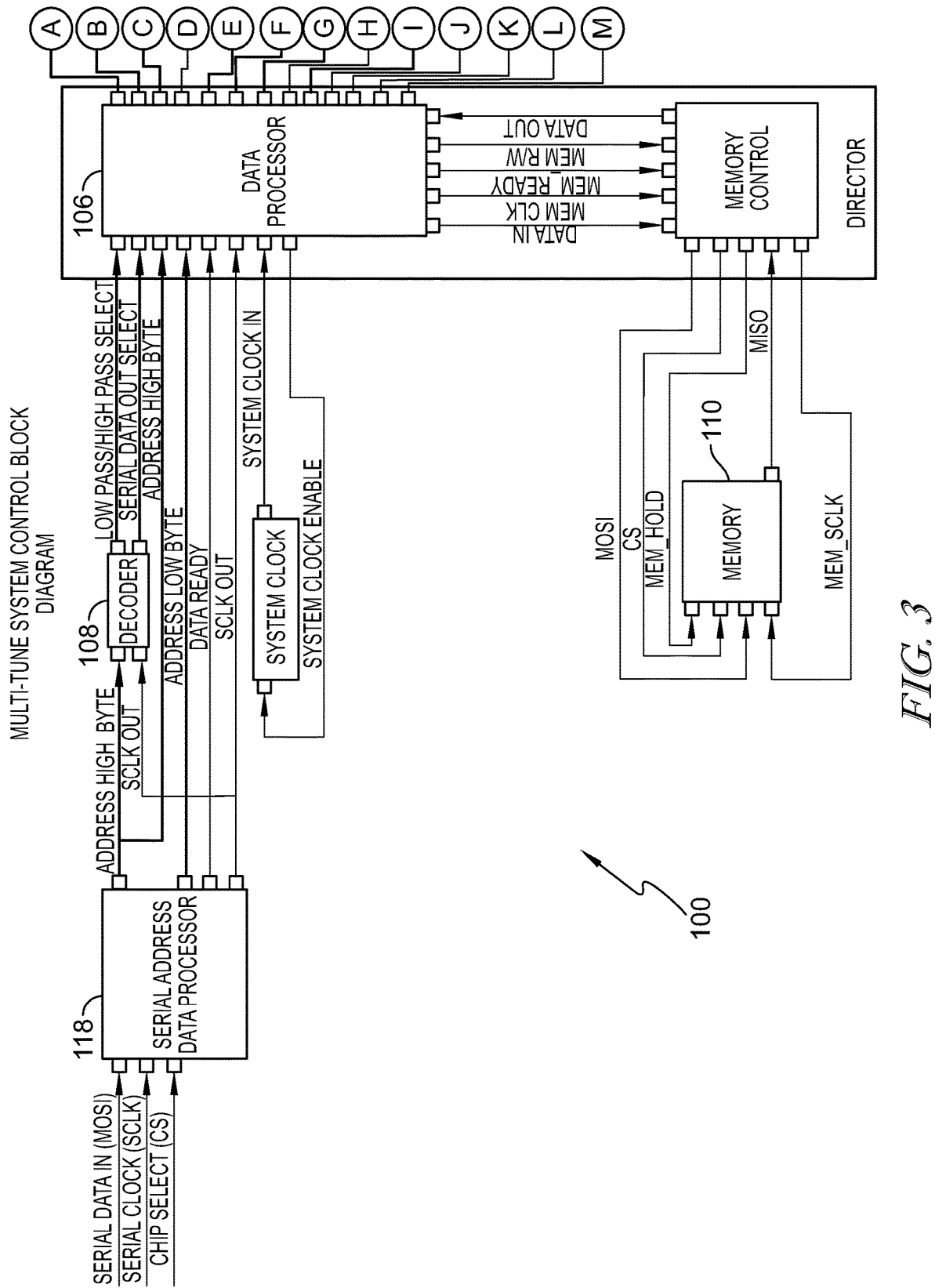
FIG. 3 is a diagram of a multi-tune filter system.
Figure 3:
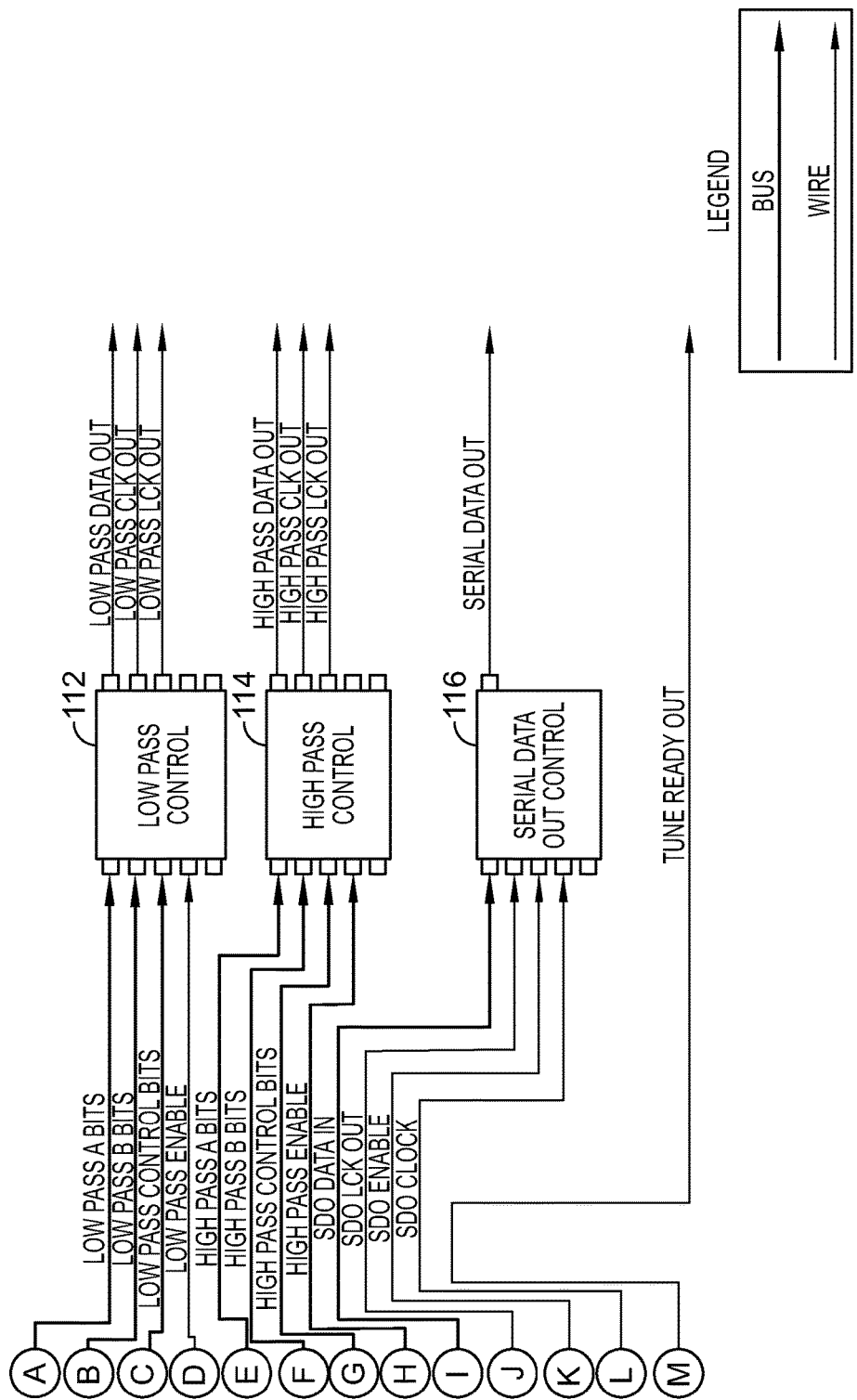

Referring now to FIG. 3, a diagram of the multi-tune filter system 100 comprising a data processor 106, a decoder 108, memory 110, low pass control 112, high pass control 114, serial data out control 116, and a serial data processor 118 is shown. In an exemplary embodiment, the high pass control 114 operates first, second, and third high pass filter legs, 120, 122, 124 shown in FIG. 4. Similarly, the low pass control 112 operates first, second, and third low pass filter legs 126, 128, 130 shown in FIG. 5. FIGS. 6-10 are exemplary frequency graphs of frequency ranges in which the multi-tune filter system 100 operates and implements a tunable frequency range filter.

Referring back to FIG. 4, a lumped-element high-pass filter topology of each of the three high pass filter legs 120, 122, 124 comprises a 5th-order, elliptic Cauer-Chebyshev filter implemented with a minimum number of capacitors 188. Two capacitors operably connected to each of the three legs 120, 122, 124 are tunable through two 8-bit digitally controlled capacitor arrays/sections 190. The capacitor arrays/sections 190 tune transmission zeros of a transfer function thereby resulting in corresponding adjustment of a filter cutoff frequency for each of the three high pass filter legs 120, 122, 124 while maintaining balanced attenuation flybacks.

Typically, as the cutoff frequency is tuned away from a nominal value, performance of an elliptic filter may decrease, higher flyback in the attenuation range of the filter may be produced, matching from the nominal input/output impedance (e.g., 50 ohm) may worsen, and higher insertion loss at the passband may occur. To address these characteristics, the multi-tune filter system 100 utilizes multi-aperture core wideband impedance transformers T2, T3 to facilitate tuning. The impedance transformers T2, T3 adjust the input/output impedance of each of the first, second, and third high pass filter legs 120, 122, 124 from a nominal level to a higher or lower level depending on a desired cutoff frequency.

Figure 21:
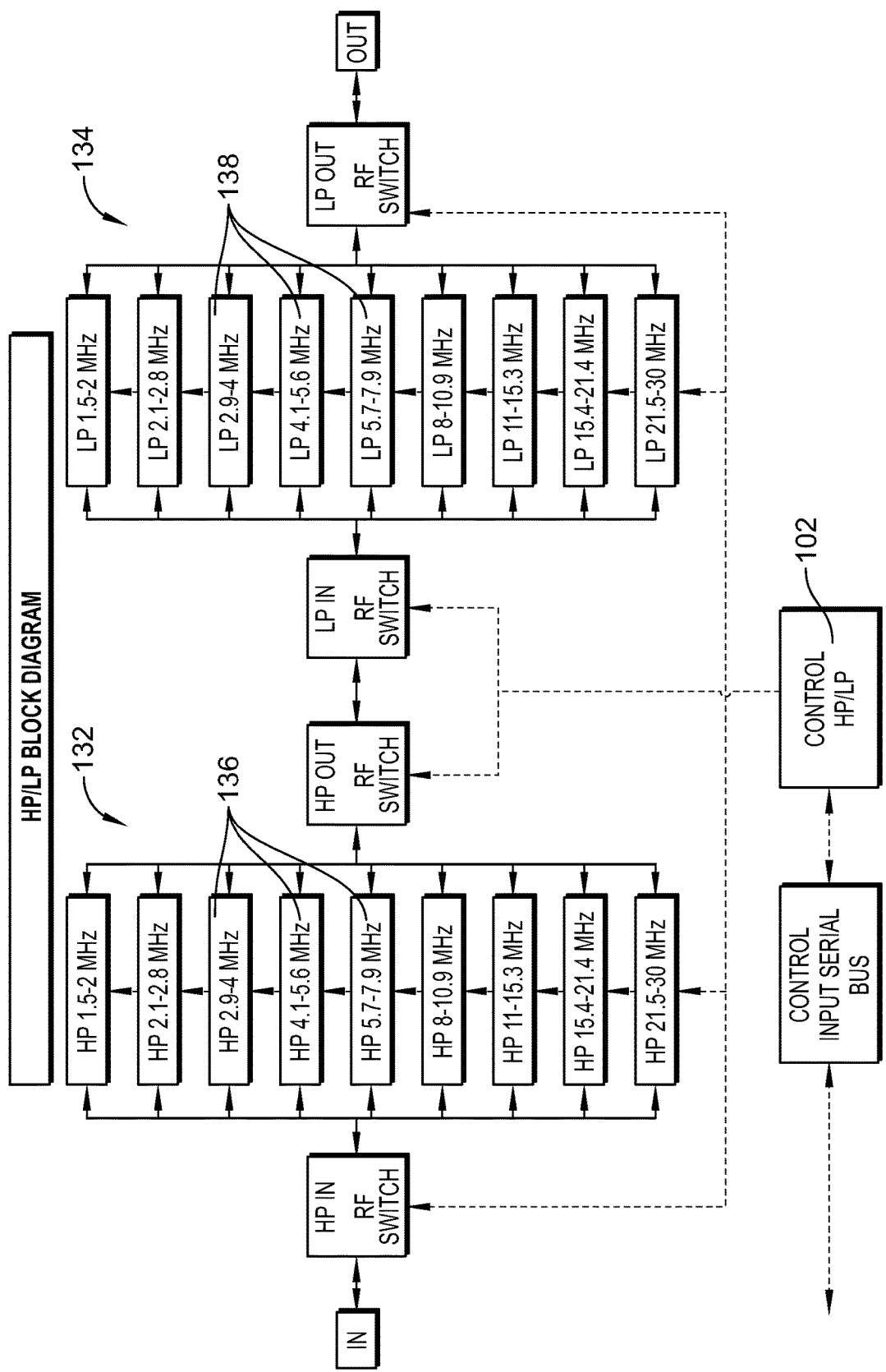
FIG. 21 is a block diagram illustrating a multi-tune filter system including a high pass filter array/section and a low pass filter array/section.

To implement lower cutoff frequencies, the impedance transformers T2, T3 adjust each high pass filter leg 120, 122, 124, as needed, from nominal 50 ohms to 35 ohms. To implement higher cutoff frequencies, the impedance transformers adjust each high pass filter leg 120, 122, 124, as needed, from nominal 50 ohms to 70 ohms. In the example architecture of FIG. 4, the SW401, SW501, SW601, SW406, SW506, and SW606 RF switches operate to select the 35 ohm impedance at lower cutoff frequencies and 70 ohm impedance at higher cutoff frequencies from the T2 and T3 impedance transformers. This technique extends the tunable frequency range of each of the three legs 120, 122, 124, while maintaining low attenuation flybacks and low passband insertion loss. Selection of 35, 50 or 70 ohms as input/output impedance on each of the high pass filter legs 120, 122, 124 splits the frequency range of each leg into three subranges, one for each impedance setting. The resulting nine high-pass frequency range selection blocks, as shown in FIG. 21, present the frequency range of each of the three high pass filter legs 120, 122, 124 as having three subranges on each leg.

Figure 5:
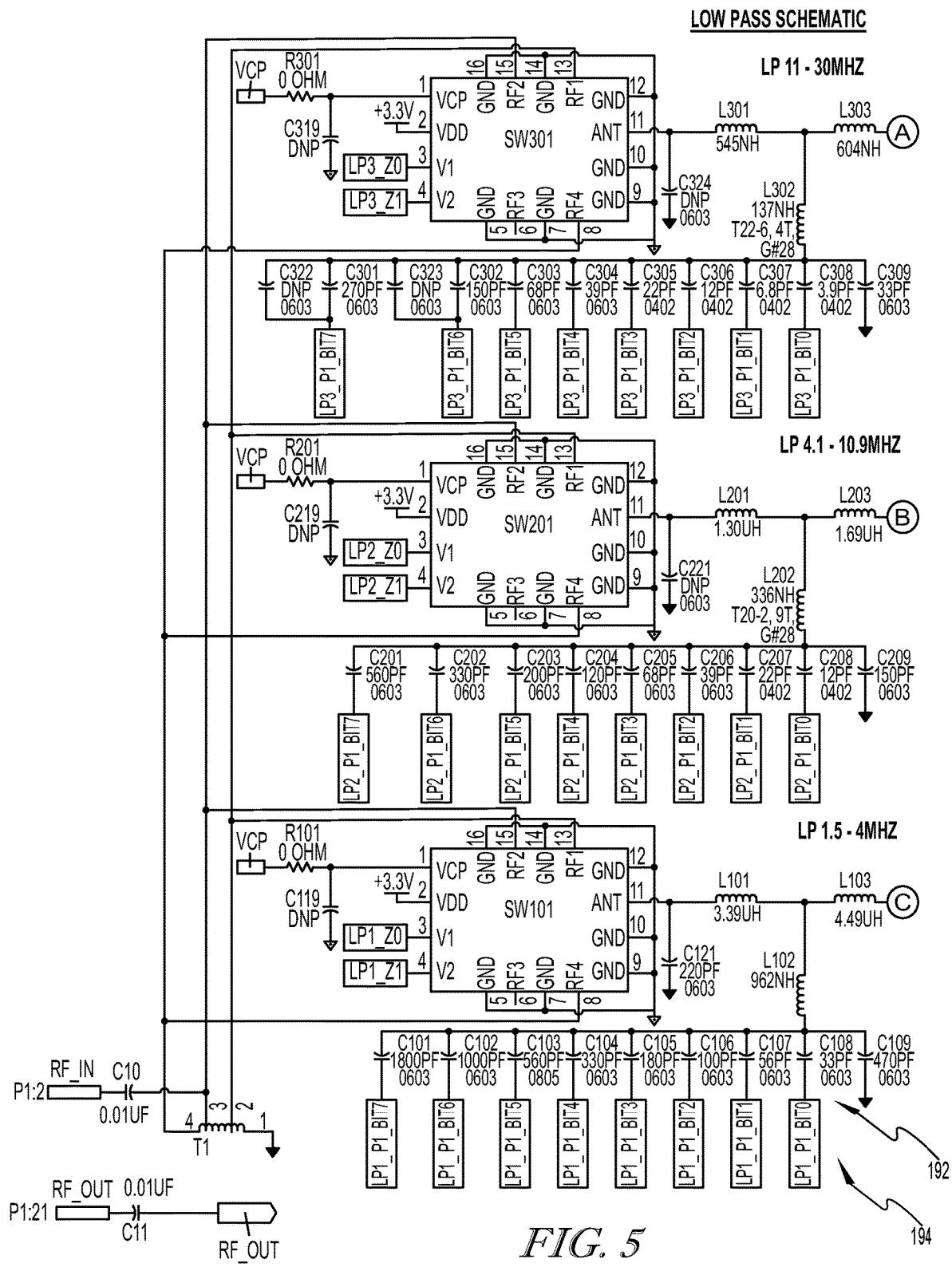
FIG. 5 is a diagram of first, second, and third low pass filter legs of the multi-tune filter system.
Figure 5:
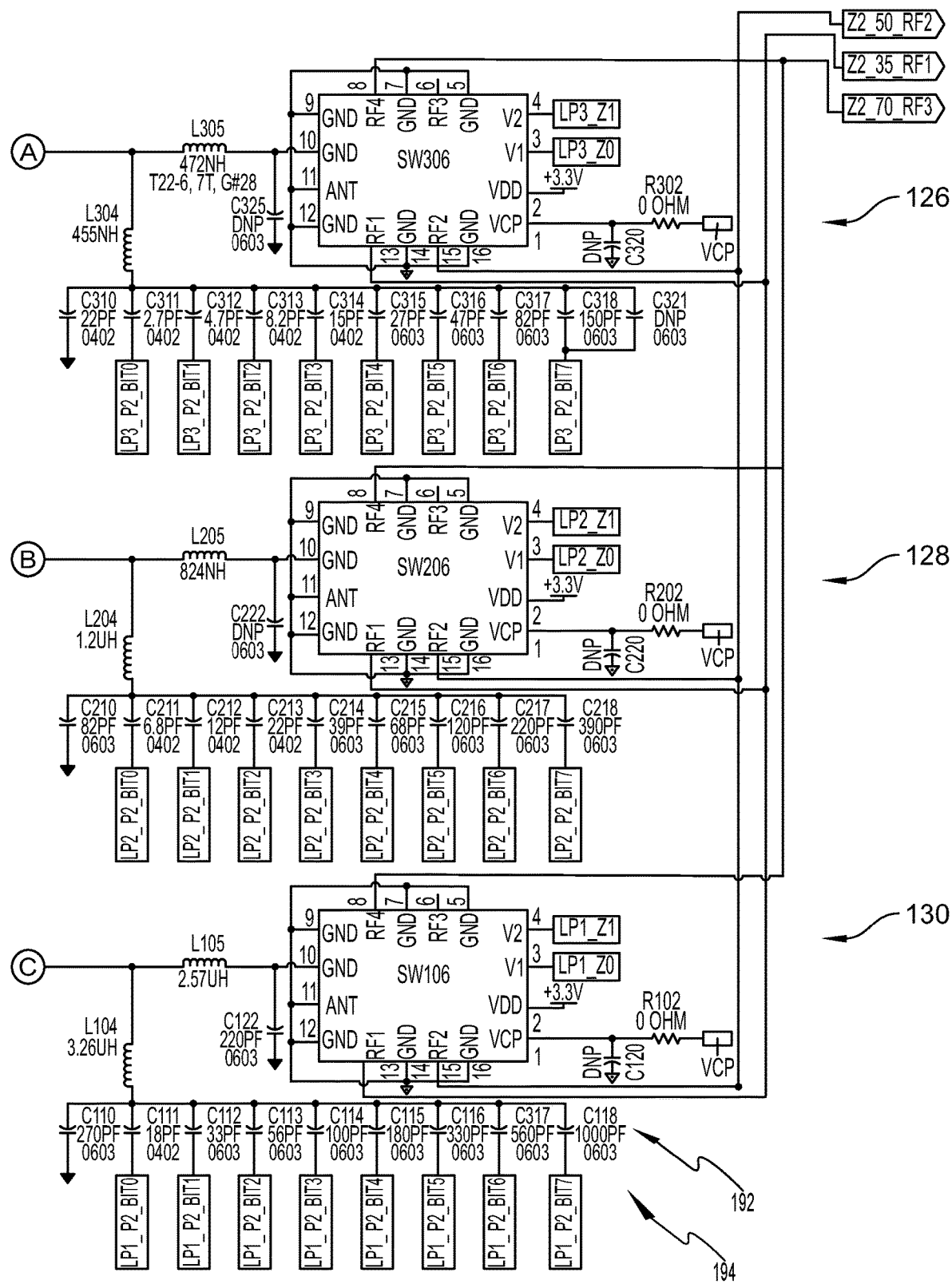
Figure 6:
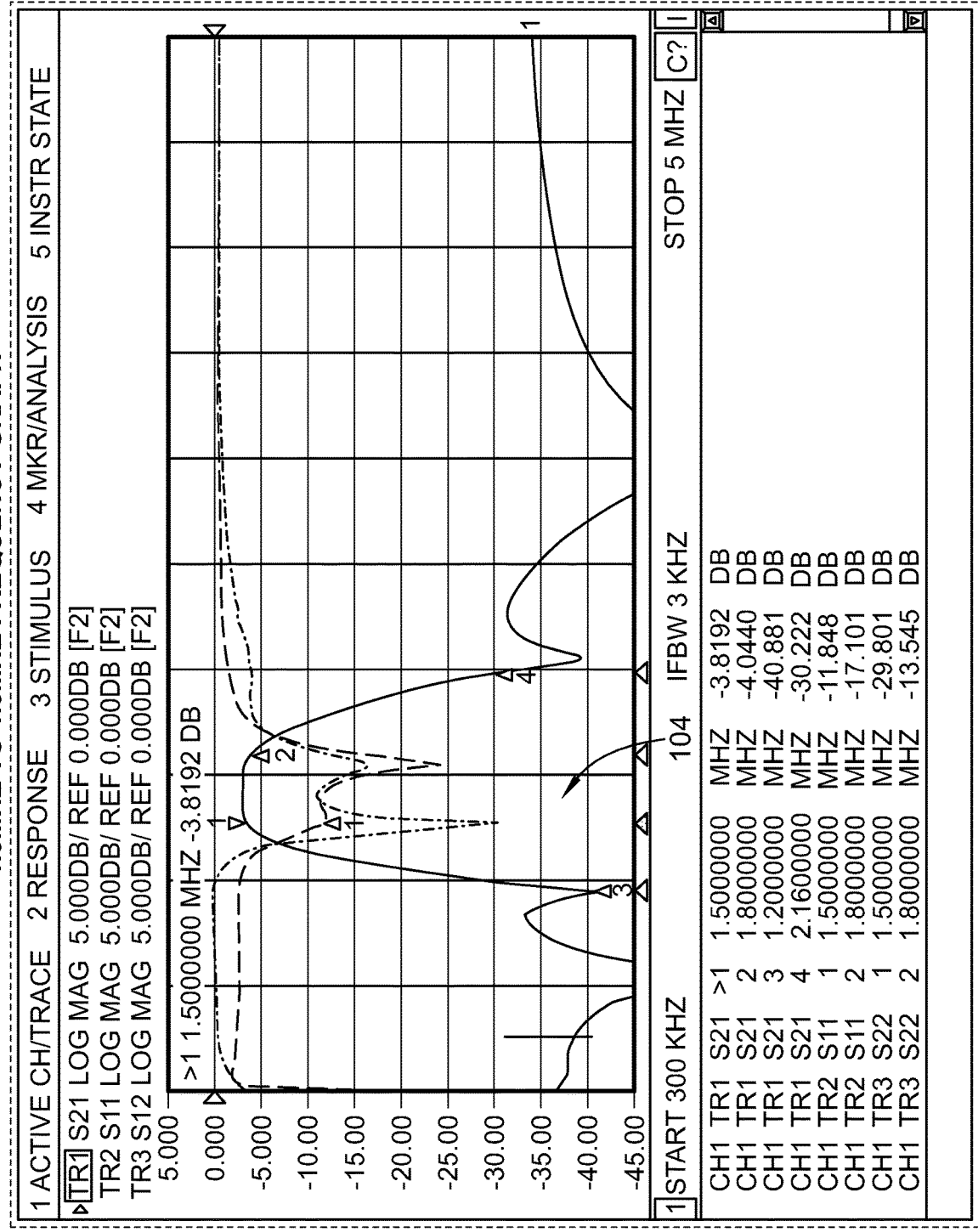
FIGS. 6-10 are exemplary frequency graphs of frequency ranges in which the multi-tune filter system operates.
Figure 7:
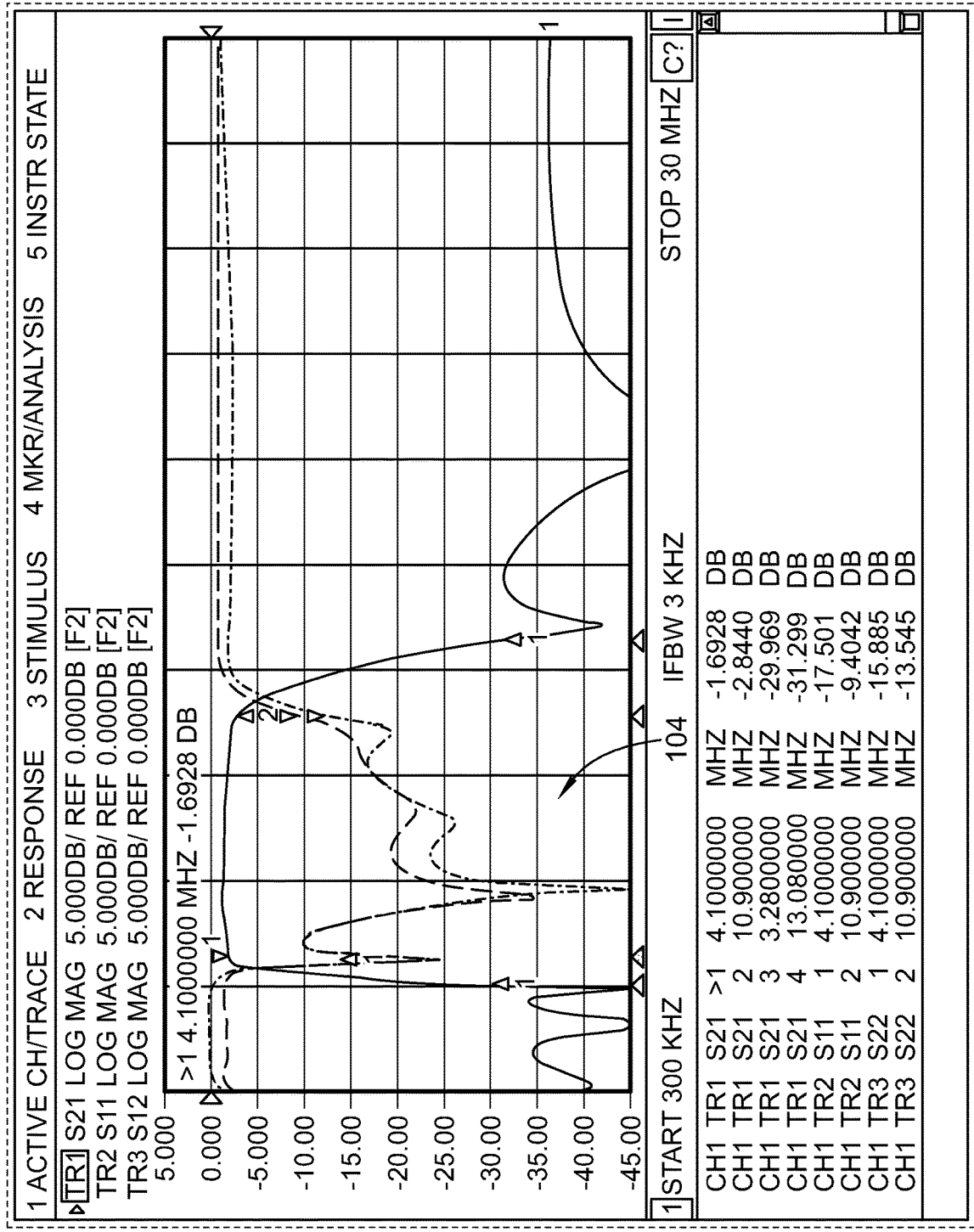
Figure 8:
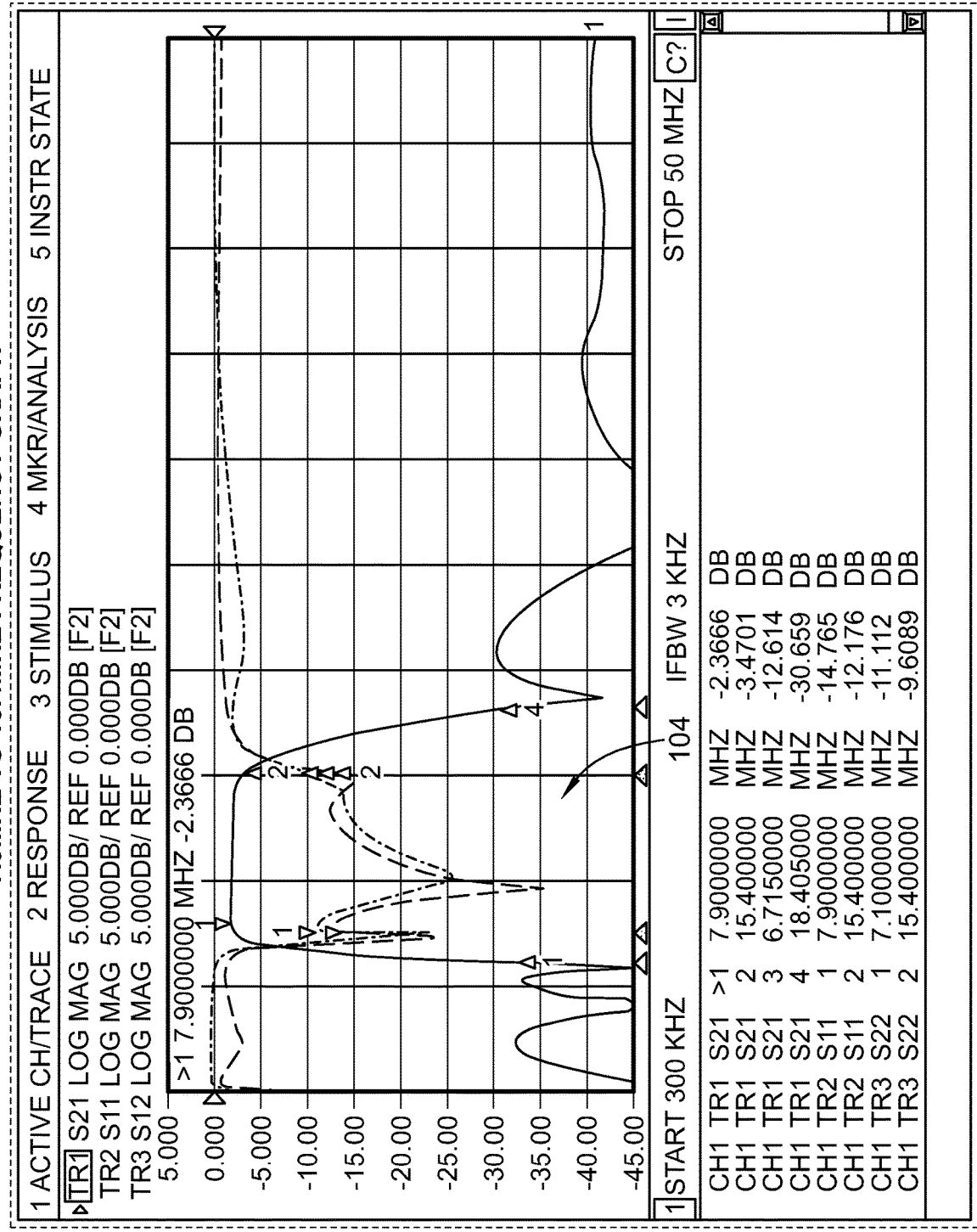
Figure 9:
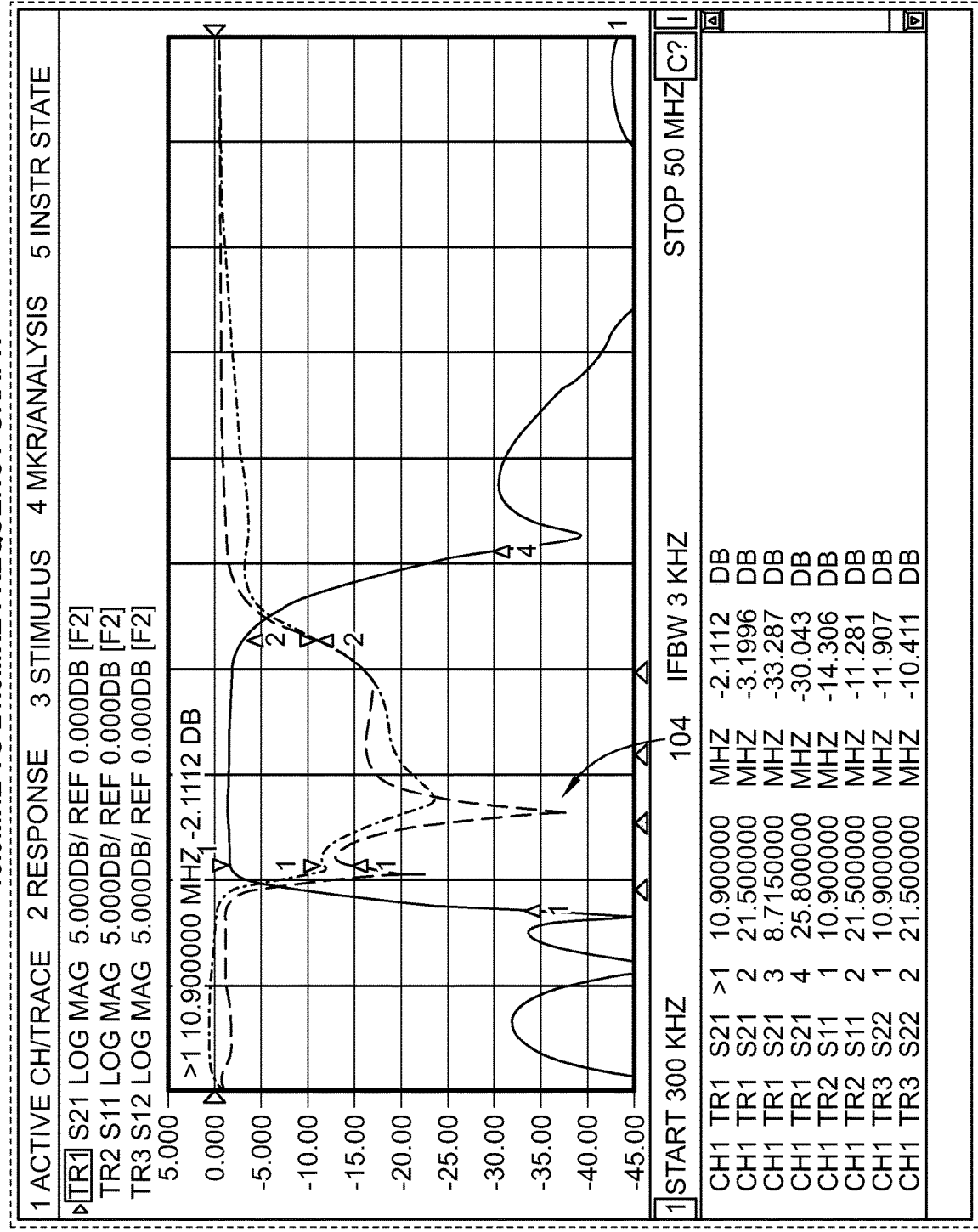
Figure 10:
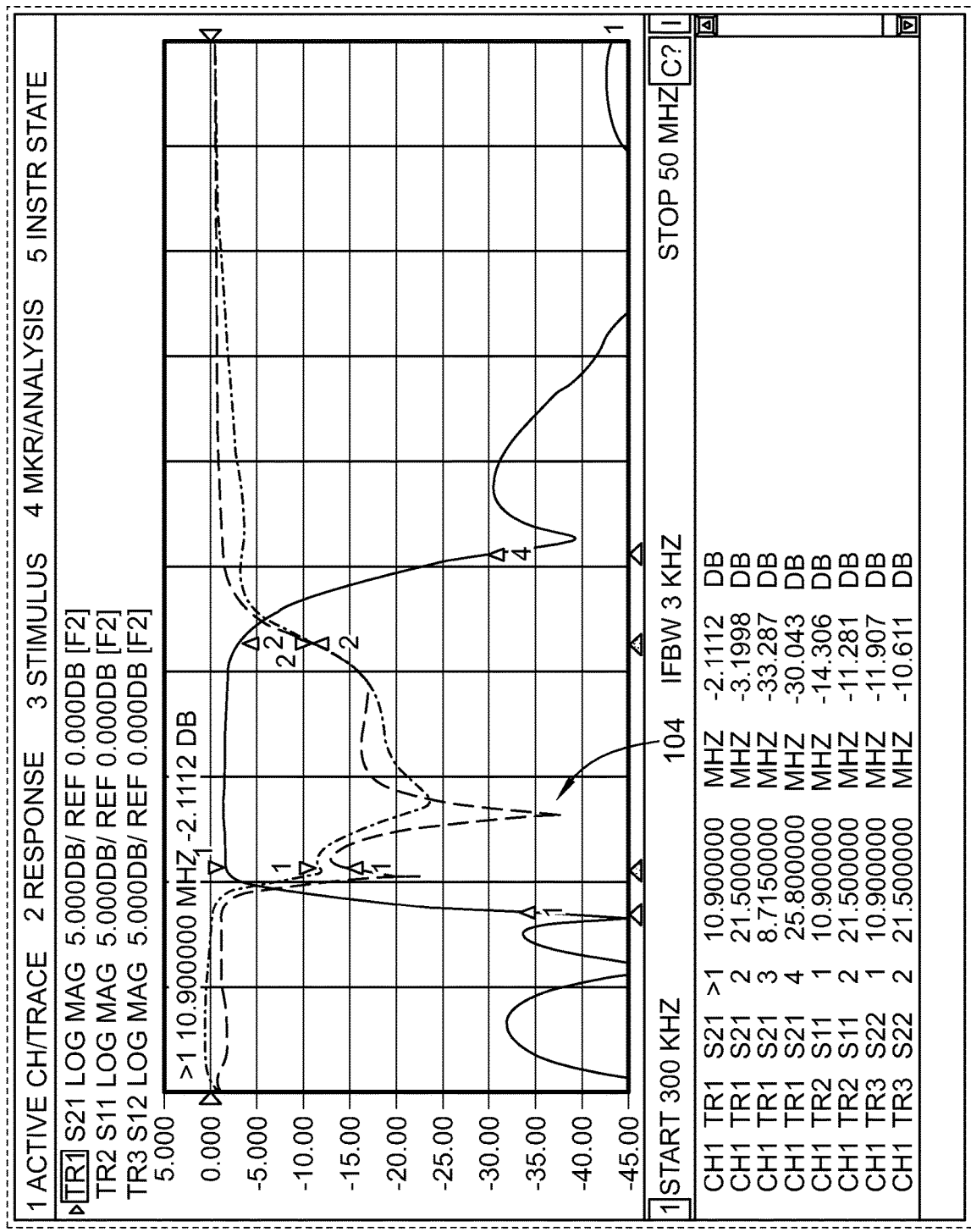

In FIG. 5, a lumped element low-pass filter topology of each of the three low pass filter legs 126, 128, 130 comprises a 5th-order, elliptic Cauer-Chebyshev filter implemented with a minimum number of capacitors 192. Two capacitors operably connected to each of the three legs 126, 128, 130 are tunable through two 8-bit, digitally controlled capacitor arrays/sections 194. The capacitor arrays/sections 192 tune the transmission zeros of the transfer function thereby resulting in corresponding adjustment of a filter cutoff frequency for each of the three low pass filter legs 126, 128, 130, while maintaining balanced attenuation flybacks.

Figure 4:
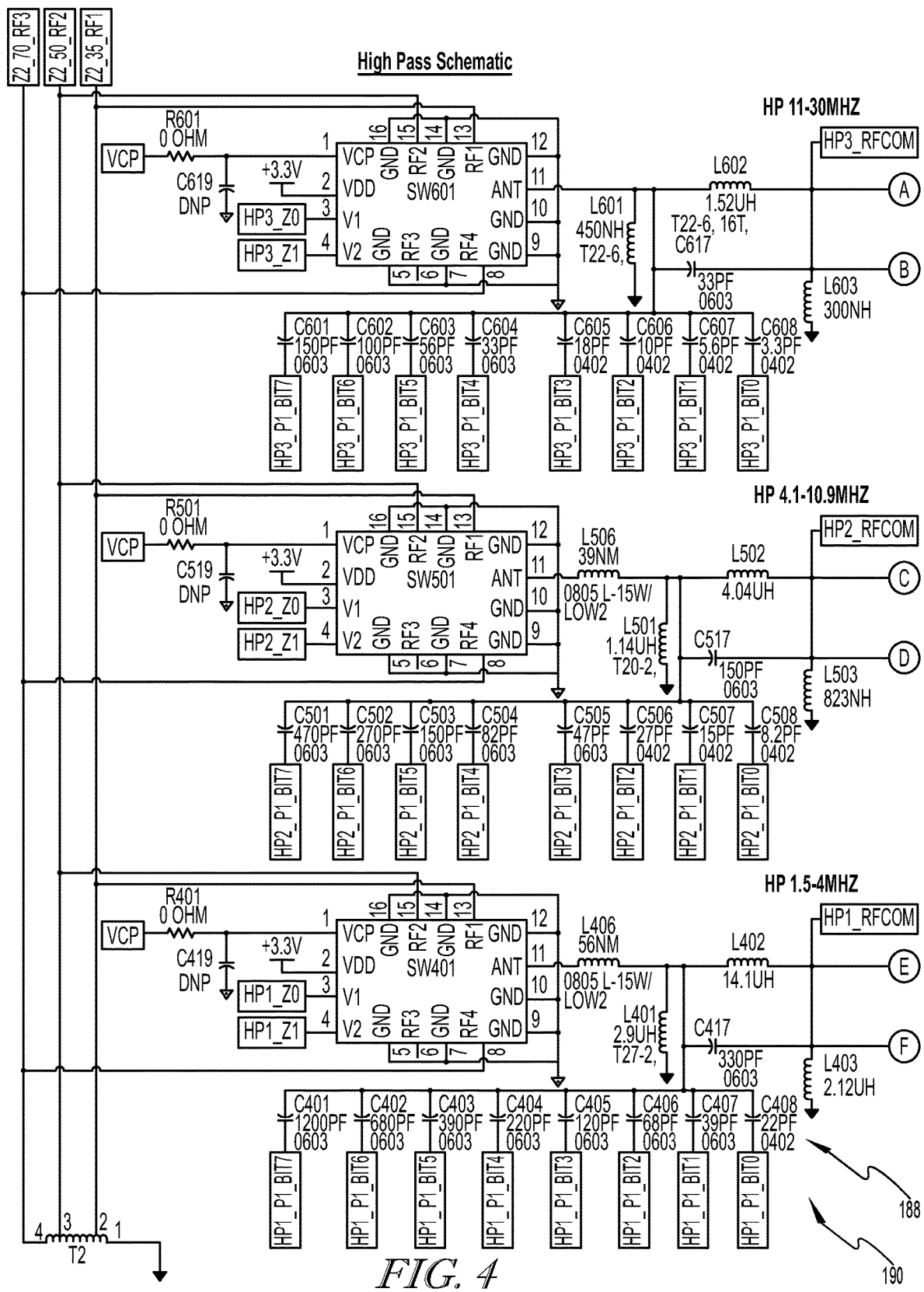
FIG. 4 is a diagram of first, second, and third high pass filter legs of the multi-tune filter system.
Figure 4:
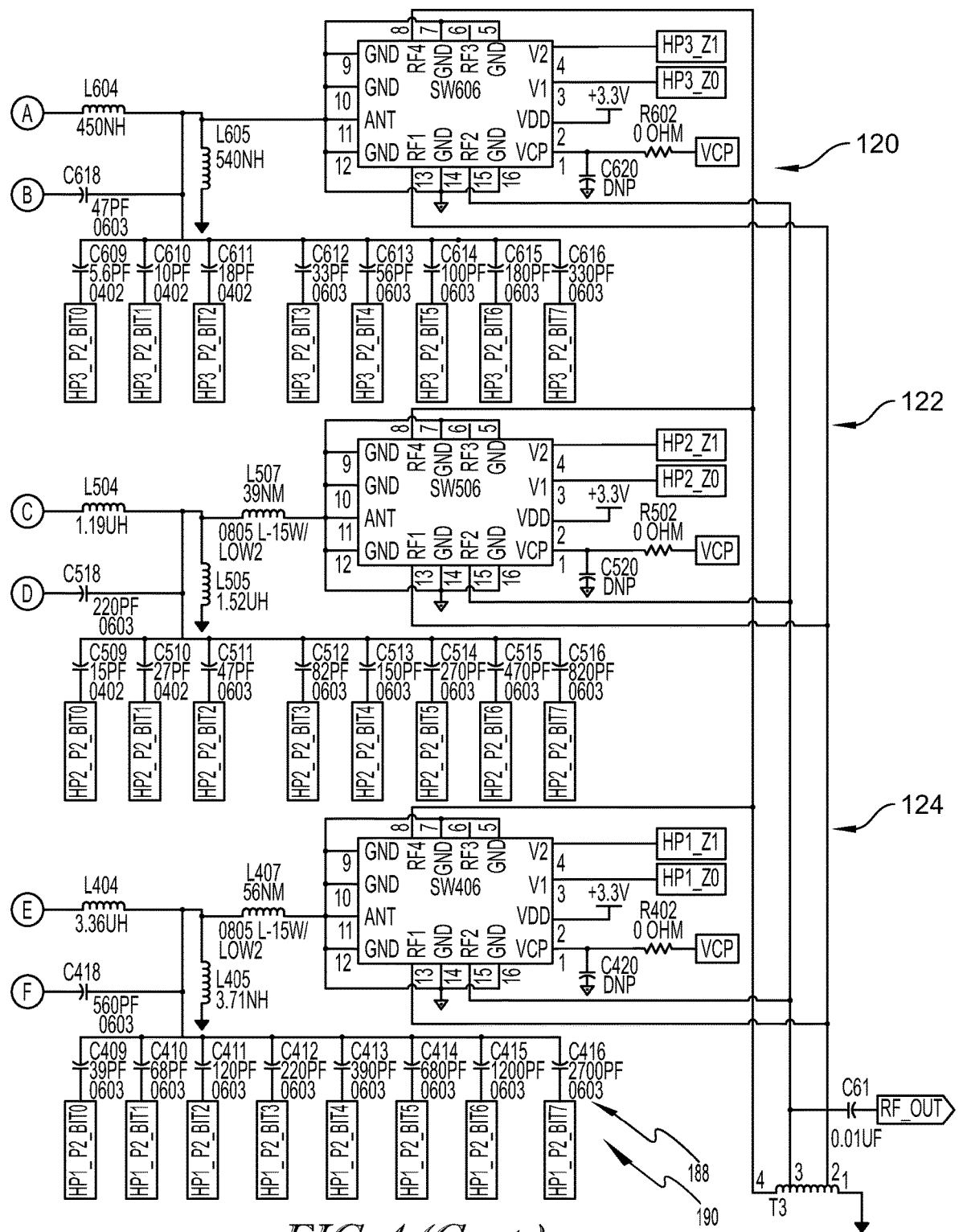

As analogously detailed with respect to the topology of FIG. 4, as the cutoff frequency is tuned away from the nominal, the performance of an elliptic filter may decrease, higher flyback in the attenuation range of the filter may be produced, matching from the nominal input/output impedance (e.g., 50 ohm) may worsen, and higher insertion loss at the passband may occur. To address these characteristics, the multi-tune filter system 100 utilizes multi-aperture core wideband impedance transformer T1 to facilitate tuning. The impedance transformer T1 adjusts the input/output impedance of each of the first, second, and third low pass filter legs 126, 128, 130 from a nominal level to a higher or lower level depending on a desired cutoff frequency.

To implement lower cutoff frequencies, the impedance transformer T1 adjusts each low pass filter leg 126, 128, 130, as needed, from nominal 50 ohms to 35 ohms. To implement higher cutoff frequencies, the impedance transformer T1 adjusts each low pass filter leg 126, 128, 130, as needed, from nominal 50 ohms to 70 ohms. In the example architecture of FIG. 5, the SW101, SW201, SW301, SW106, SW206, and SW306 RF switches operate to select the 35 ohm impedance at lower cutoff frequencies and 70 ohm impedance at higher cutoff frequencies. This technique extends the tunable frequency range of each of the low pass filter legs 126, 128, 130, while low attenuation flybacks and low passband insertion loss. The selection of 35, 50 or 70 ohms as input/output impedance on each of the low pass filter legs 126, 128, 130 splits the frequency range of each leg into three subranges, one for each impedance setting. The resulting nine low-pass frequency range selection blocks, as shown in FIG. 21, present the frequency range of each of the three low pass filter legs 126, 128, 130 as having three subranges on each leg. The output impedance of the low-pass section is selected by the wideband impedance transformer T2 of the high-pass filter section presented in FIG. 4. In certain embodiments, the high pass filter array/section 132 cascades into the low pass filter array/section 134 (see FIG. 21). Therefore, in examples, a filtered signal cascades through the high pass and low pass filter arrays/sections to implement the tunable frequency range filter.

Figure 14:
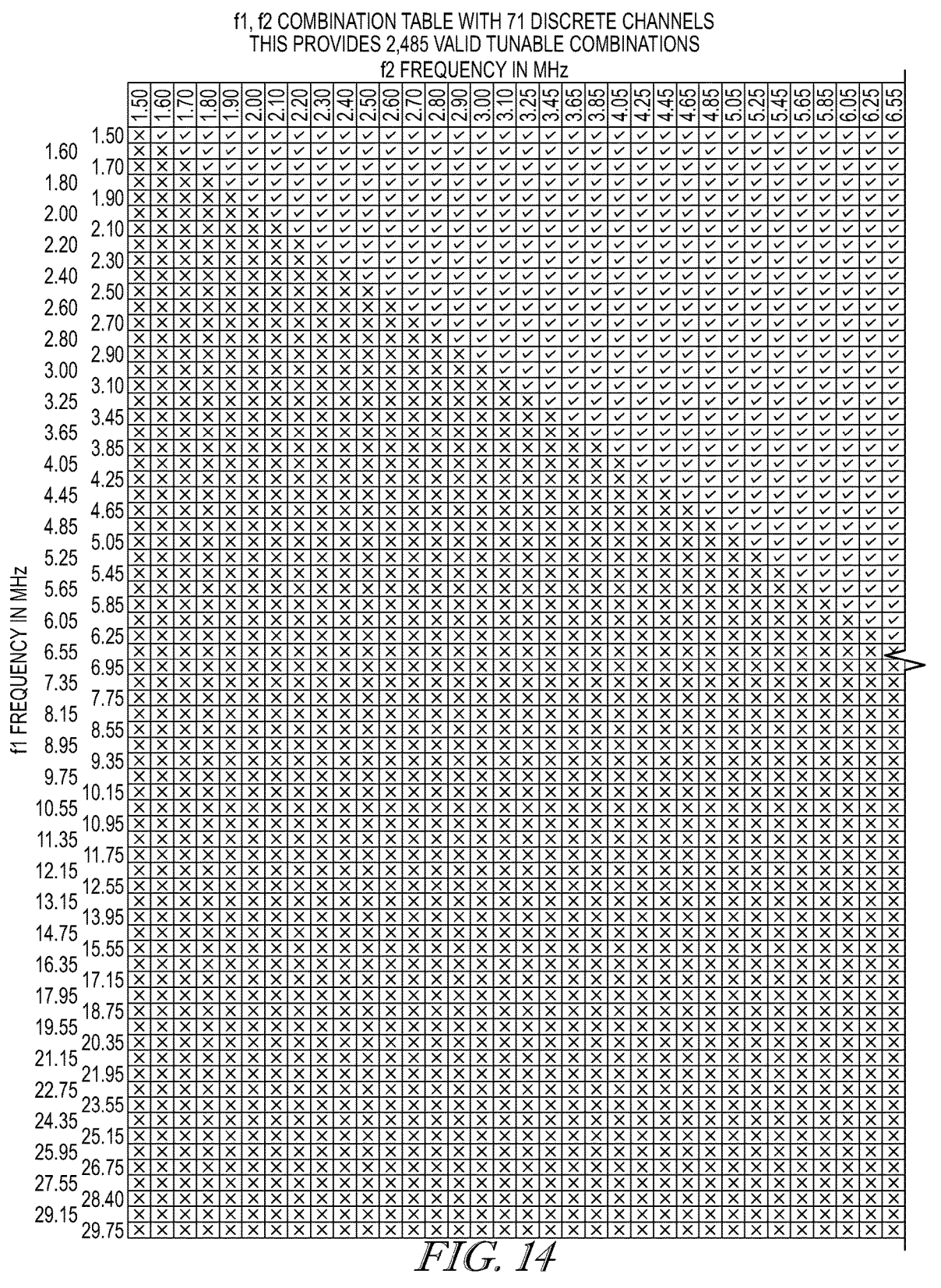
Figure 14:
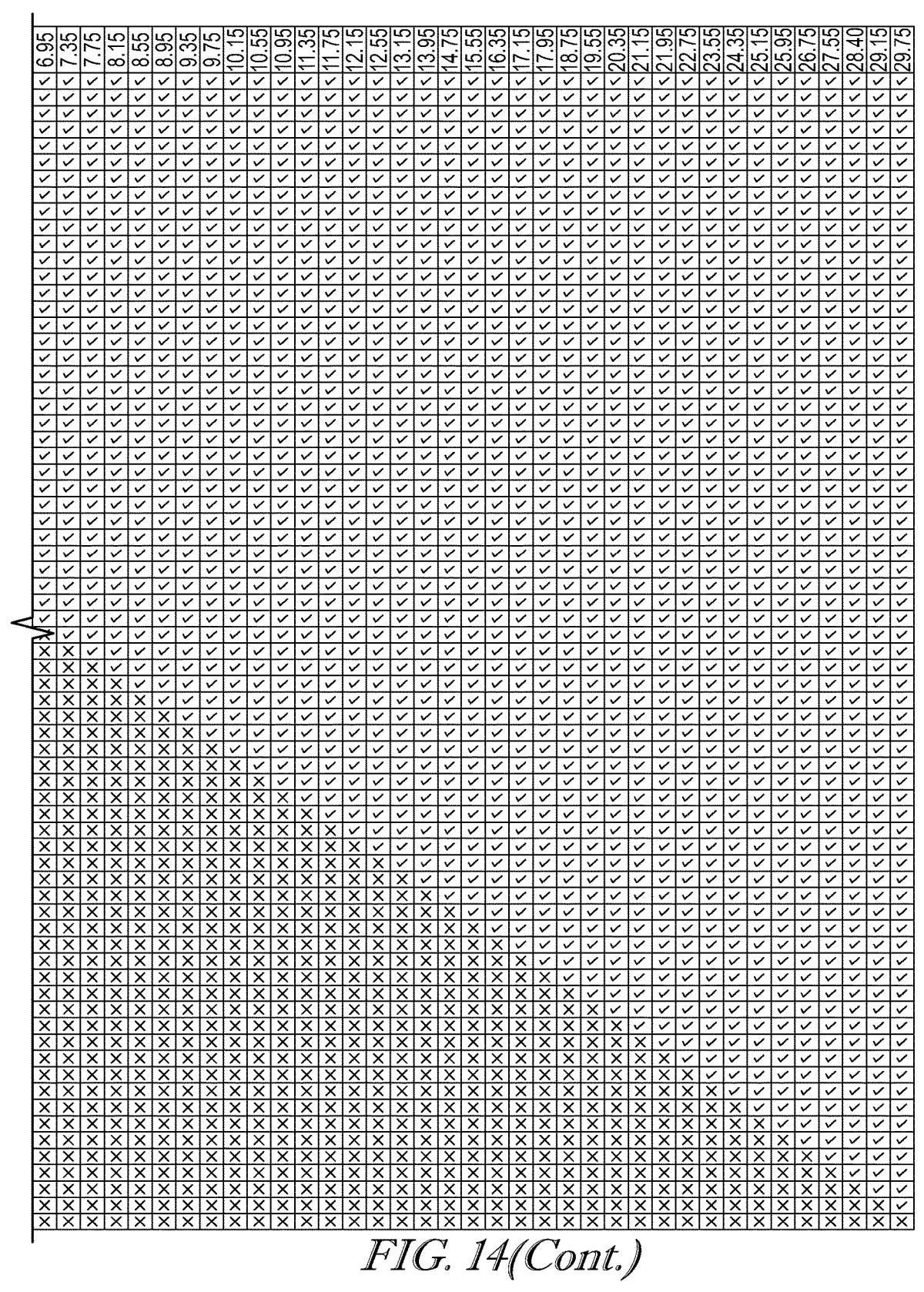

An exemplary embodiment of the multi-tune filter system 100 is controlled through a serial peripheral interface. The multi-tune filter system 100 may be commanded by two words (e.g., 16 bits each word) to set the adjustable passband 104. In examples, the two words define the first and second customizable frequency bounds f1, f2. The customizable frequency bounds f1, f2 are defined with 100 KHz resolution (e.g. a step size between selectable frequencies for f1 and f2 is 100 KHz, as also illustrated in FIG. 14). The words defining the customizable frequency bounds f1, f2 are between decimal 15 (1.5 MHz) and decimal 300 (30 MHz). In exemplary embodiments, the multi-tune filter operates within the frequency range of 1.5 MHz and 30 MHz, with frequency limits at, or at about, 1.5 MHz and at, or at about, 30 MHz. According to exemplary embodiments, the words defining the customizable frequency bounds f1, f2 may operate to adjust the impedance transformers T1, T2, T3 and the RF switches SW401, SW501, SW601, SW406, SW506, SW606, SW101, SW201, SW301, SW106, SW206, and SW306, to implement the desired tuning of the tunable frequency range filter.

In exemplary embodiments, the second customizable frequency bound f2 must be greater than f1. In other words, the upper bound of the frequency range is greater than the lower bound thereof. Referring again to the table of FIG. 14, the multi-tune filter system 100 is internally programmed with 71 geometrically distributed tune channels between 1.5 MHz and 30 MHz. The 71 geometrically distributed tune channels provide 100 KHz actual resolution with a 1.5 MHz range. The range may be gradually increased to 30 MHz with a corresponding increase in step size of 800 KHz between tune channels.

In certain embodiments, when the multi-tune filter system 100 is commanded to tune the first and second customizable frequency bounds f1, f2 between step sizes, then the customizable frequencies may be automatically tuned to nearest rounded frequencies corresponding to the 71 discrete channels shown in FIG. 14.

Figure 11:
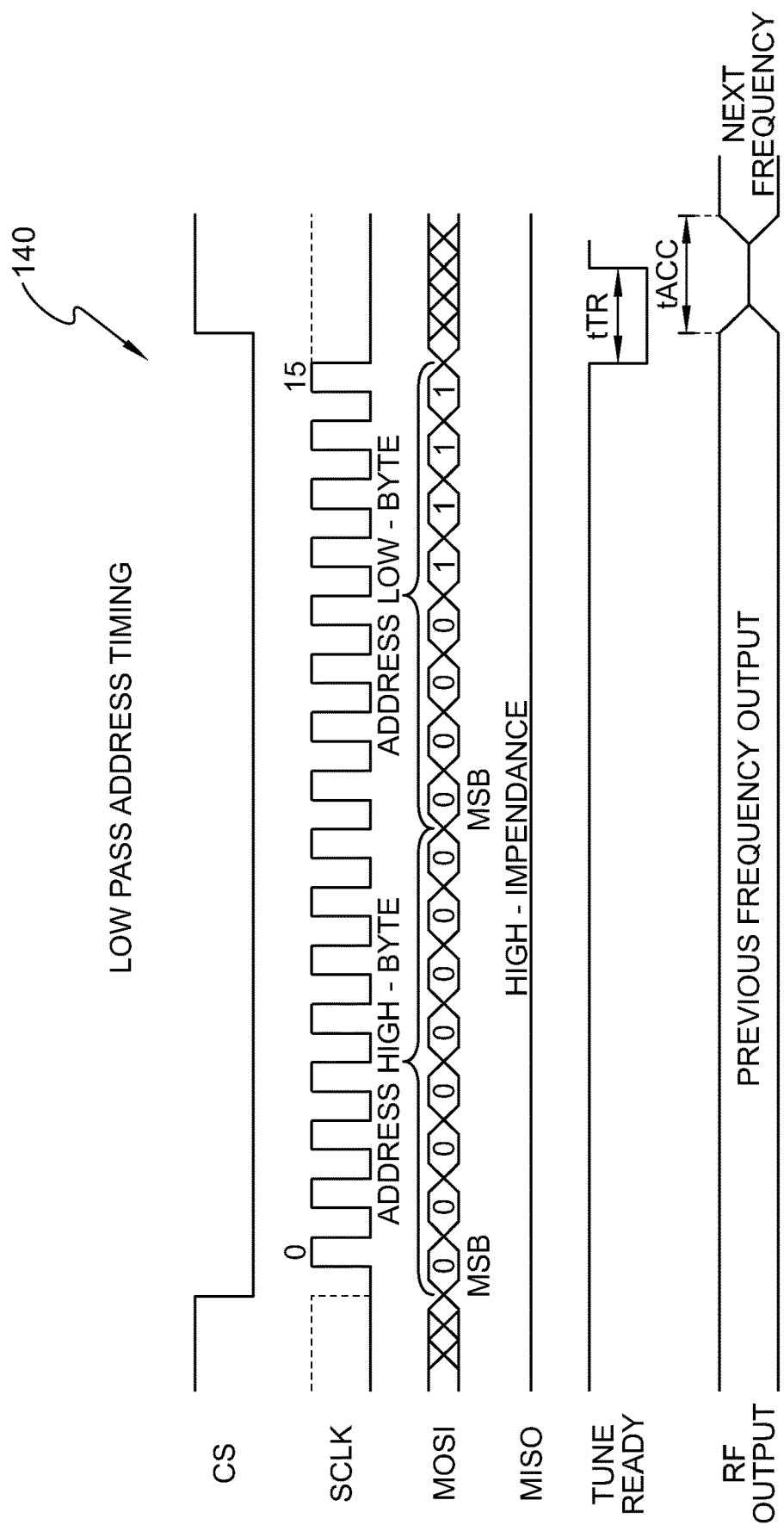
FIG. 11 is a timing diagram illustrating digital waveforms received by the multi-tune filter system during a low pass address set command.
Figure 12:
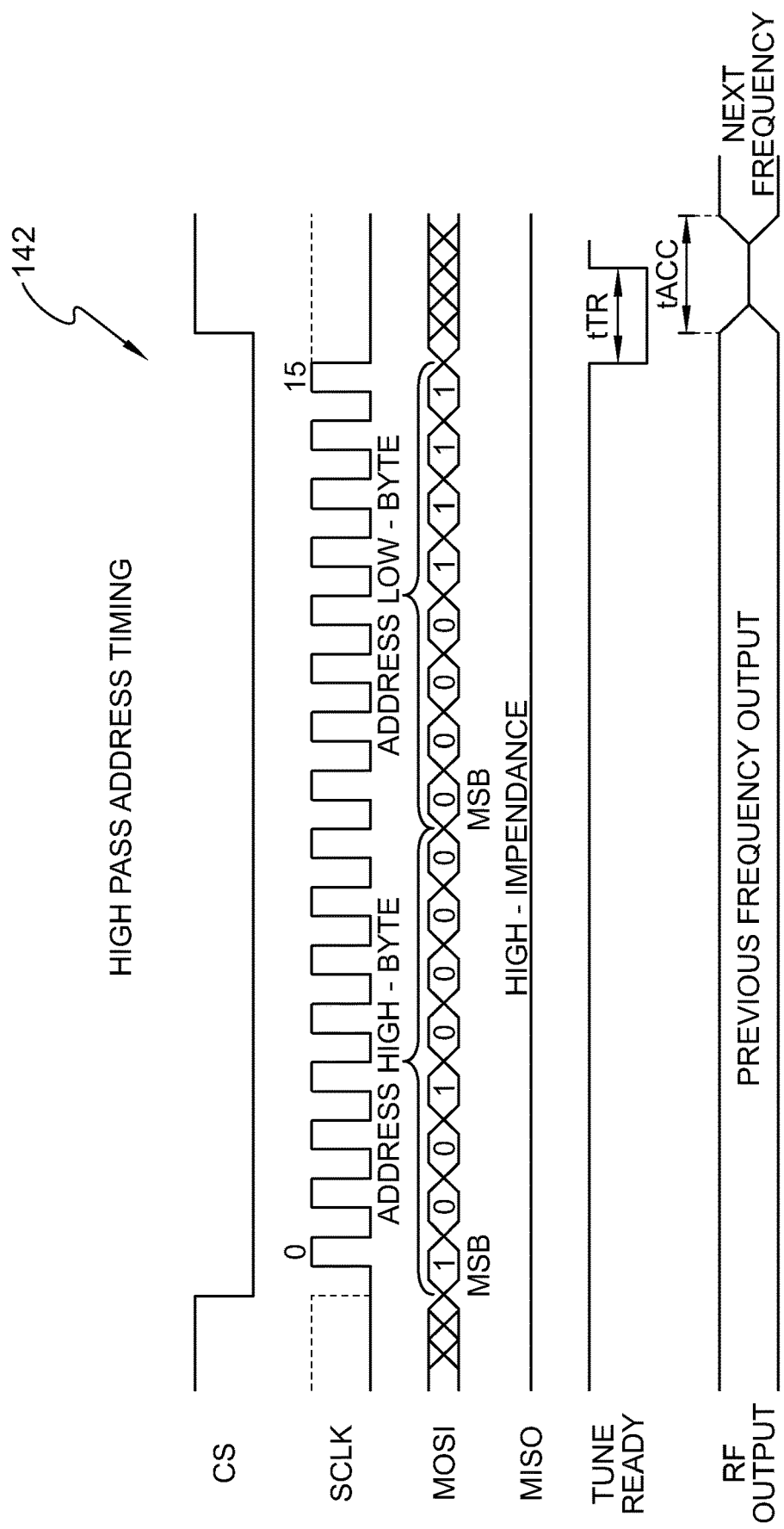
FIG. 12 is a timing diagram illustrating digital waveforms received by the multi-tune filter system during a high pass address set command.
Figure 13:
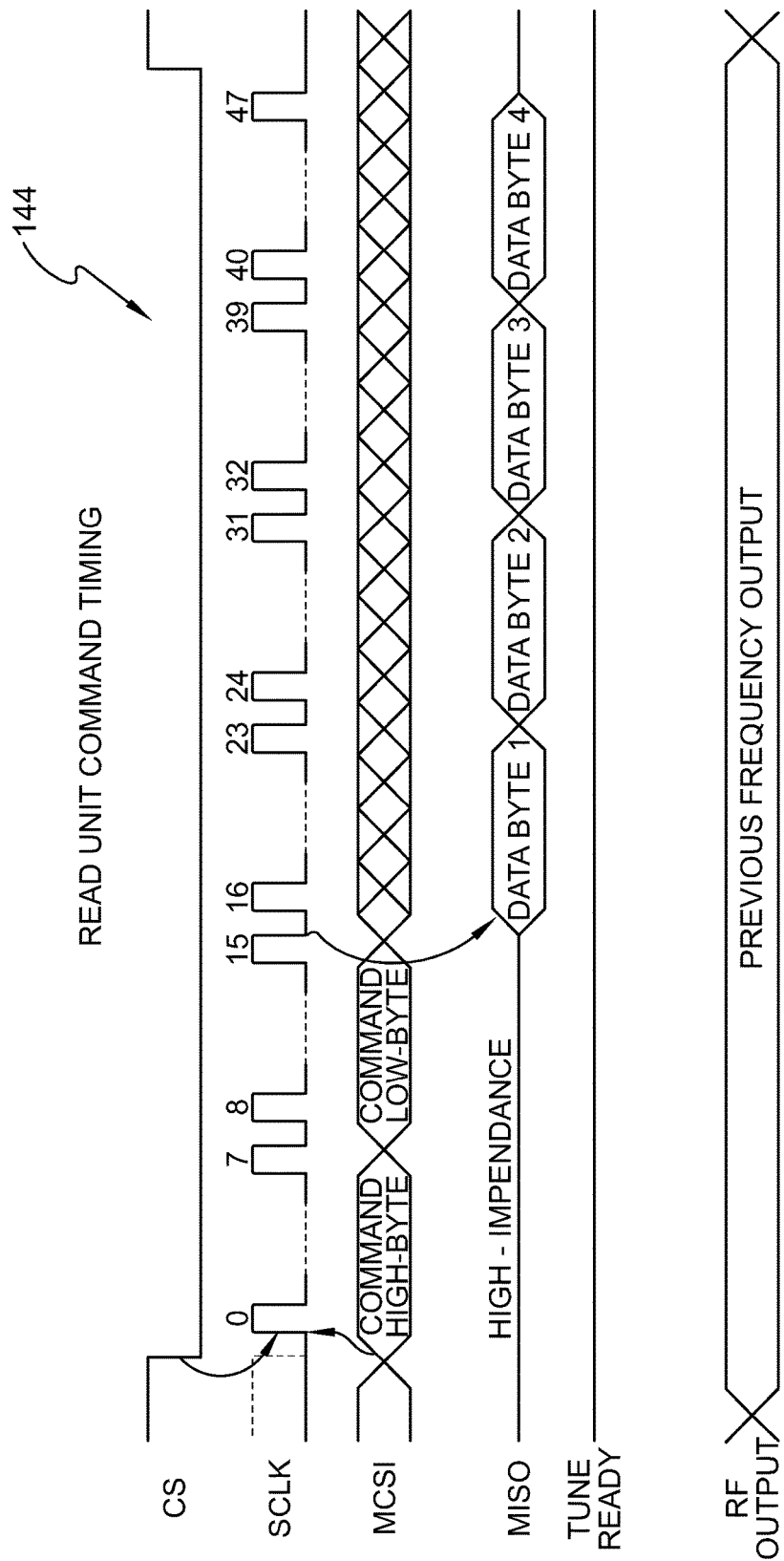
FIG. 13 is a timing diagram illustrating digital waveforms received by the multi-tune filter system during a read unit command.
Figure 15:
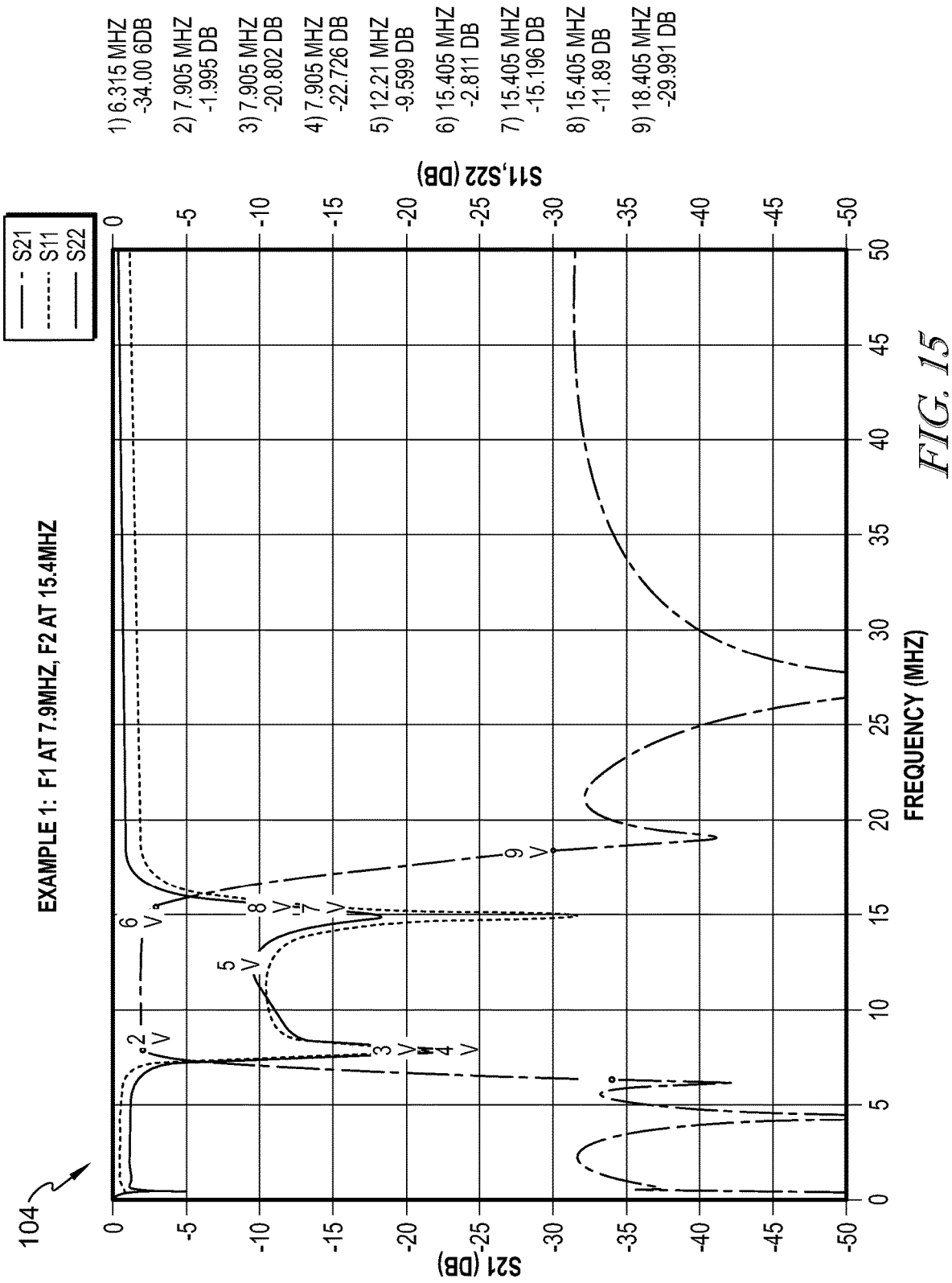
FIGS. 15-20 are exemplary frequency graphs of frequency ranges in which the multi-tune filter system operates.
Figure 16:
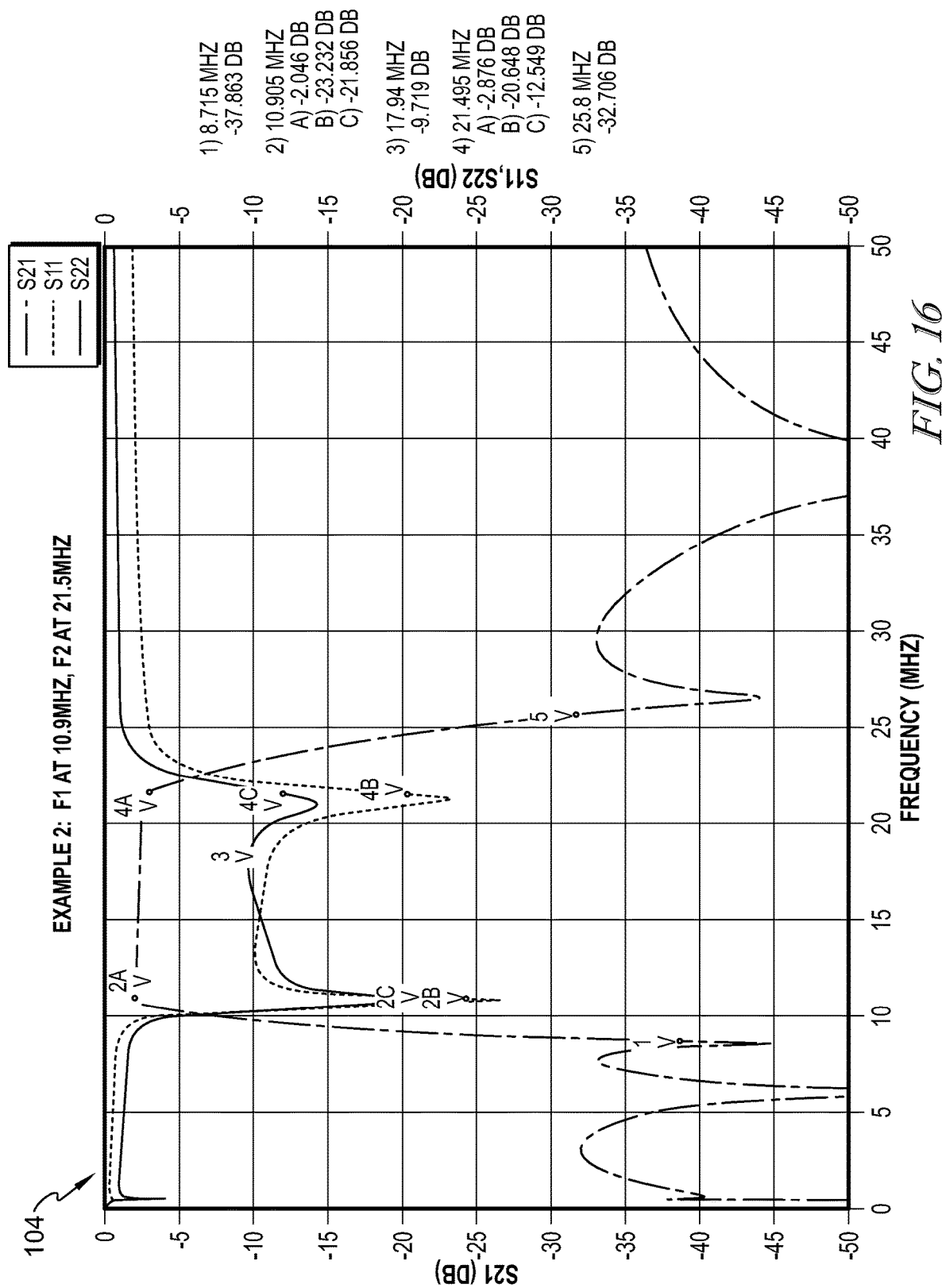
Figure 17:
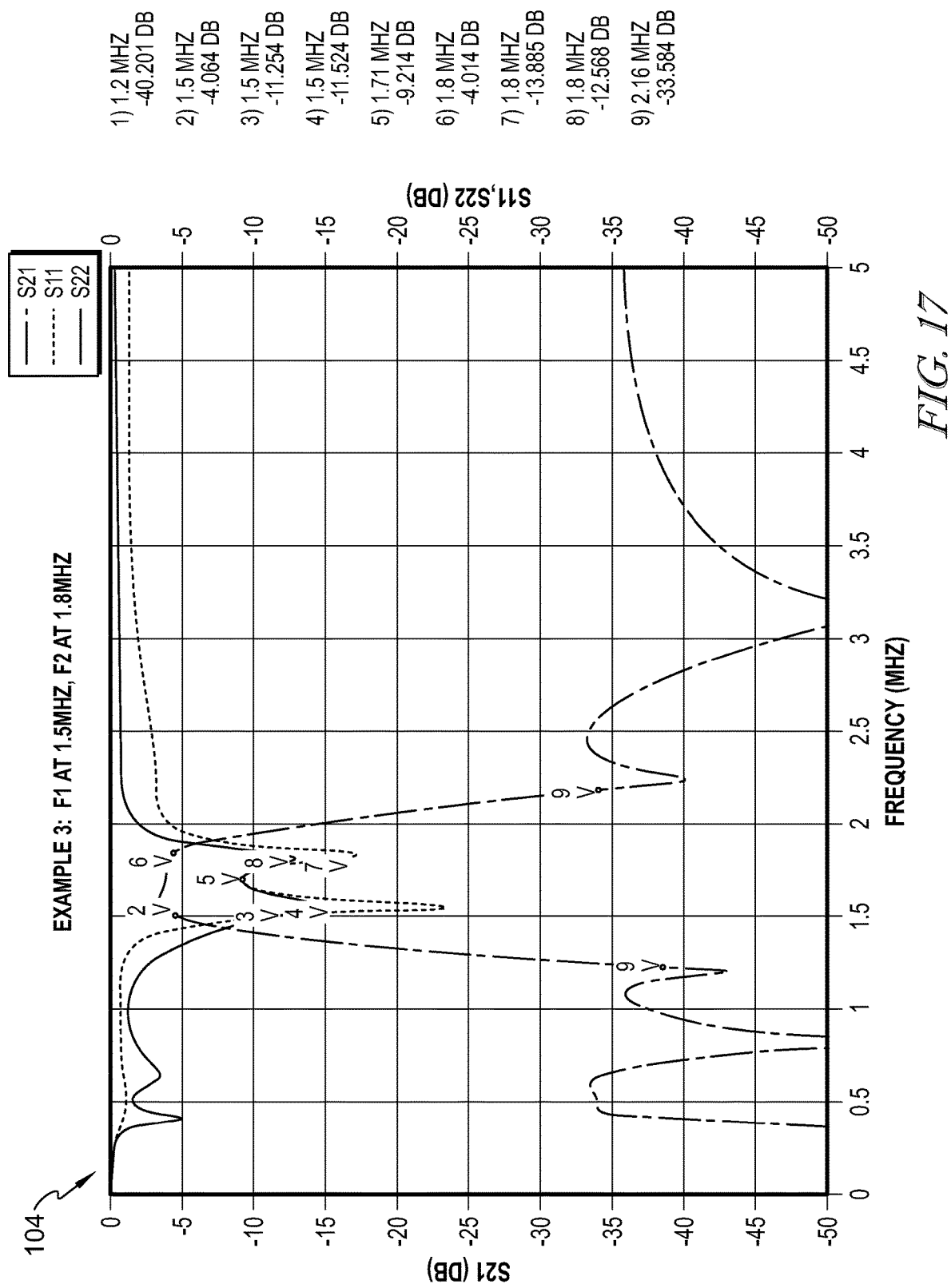
Figure 18:
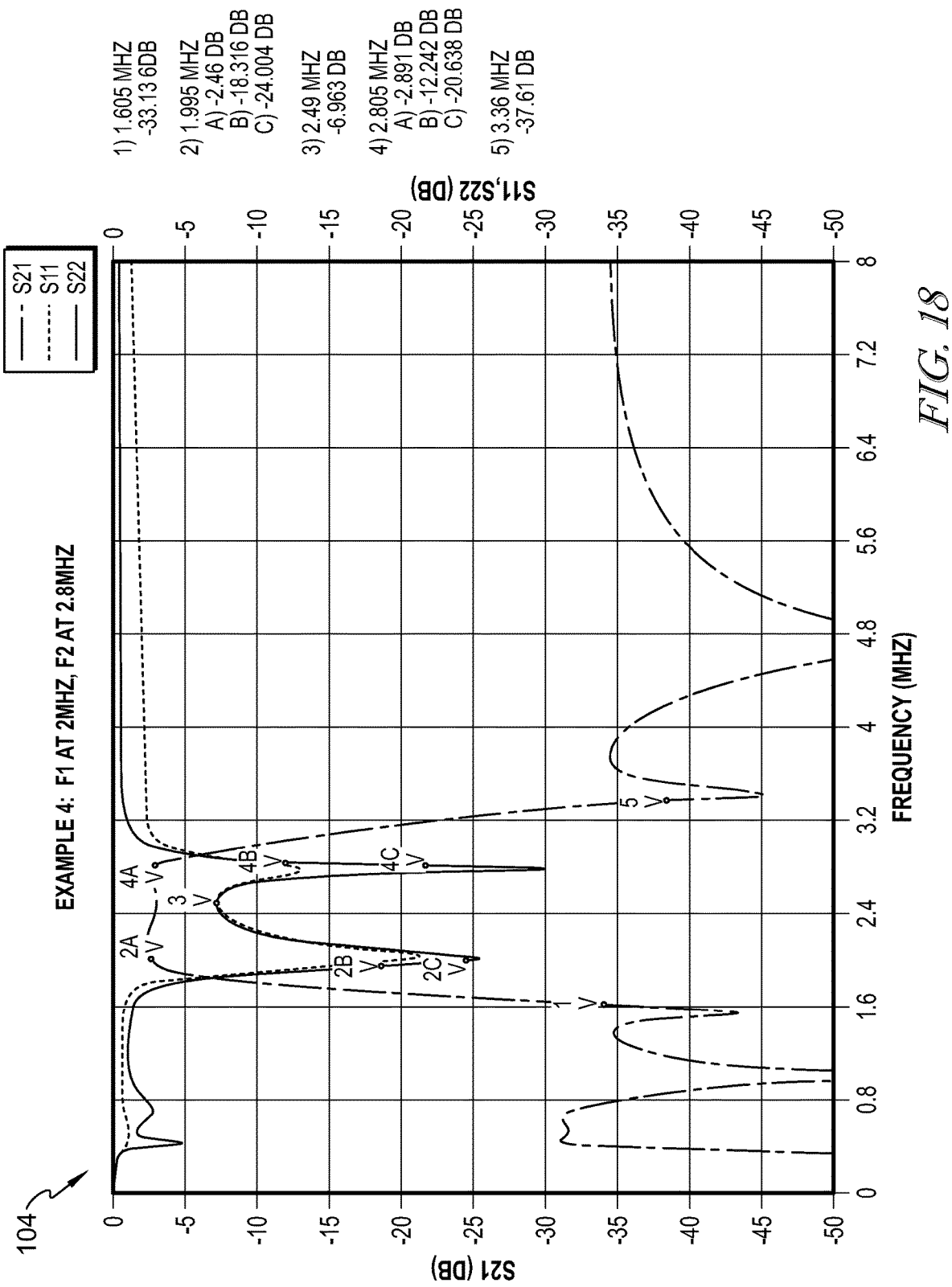
Figure 19:
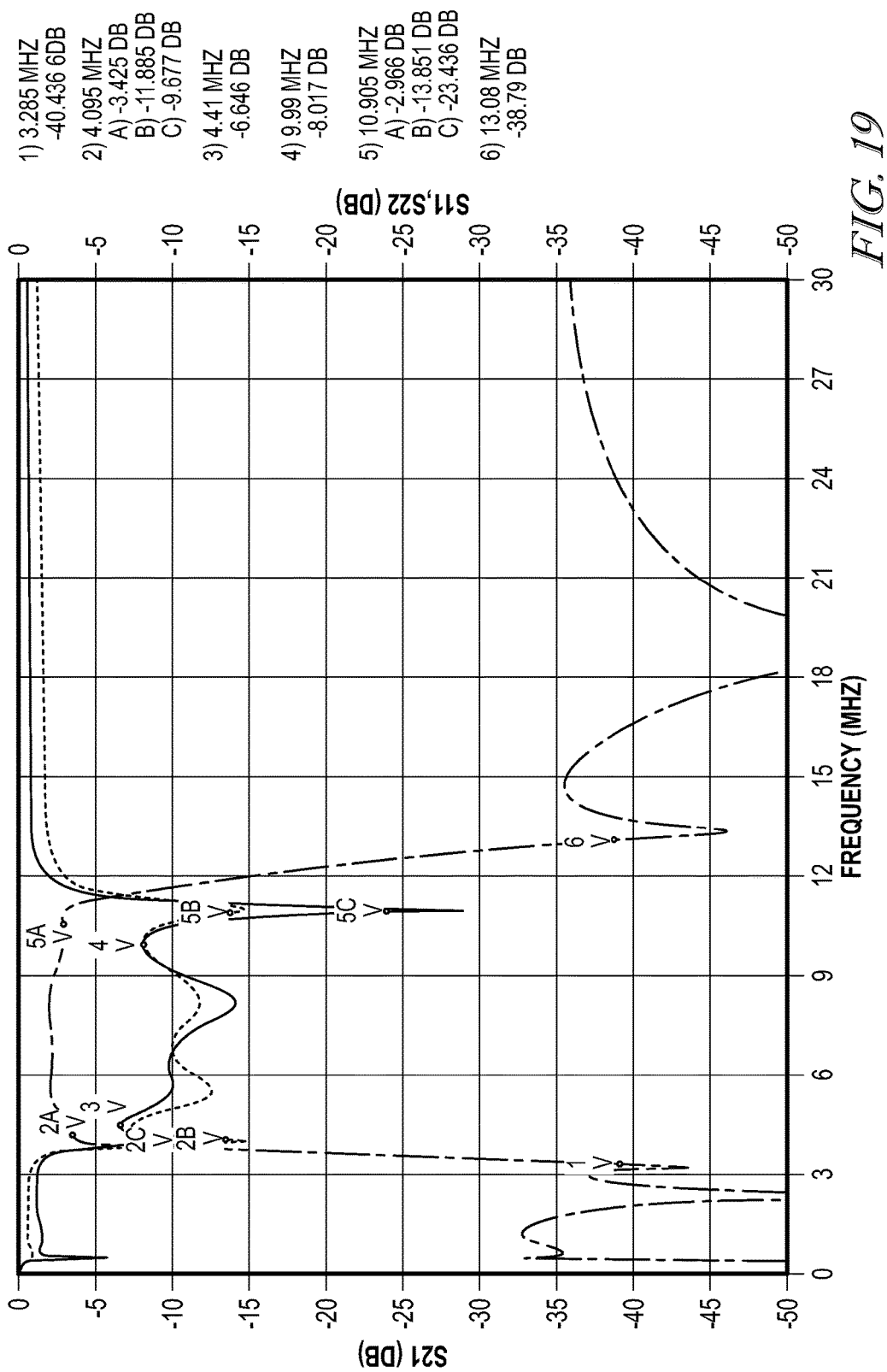
Figure 20:
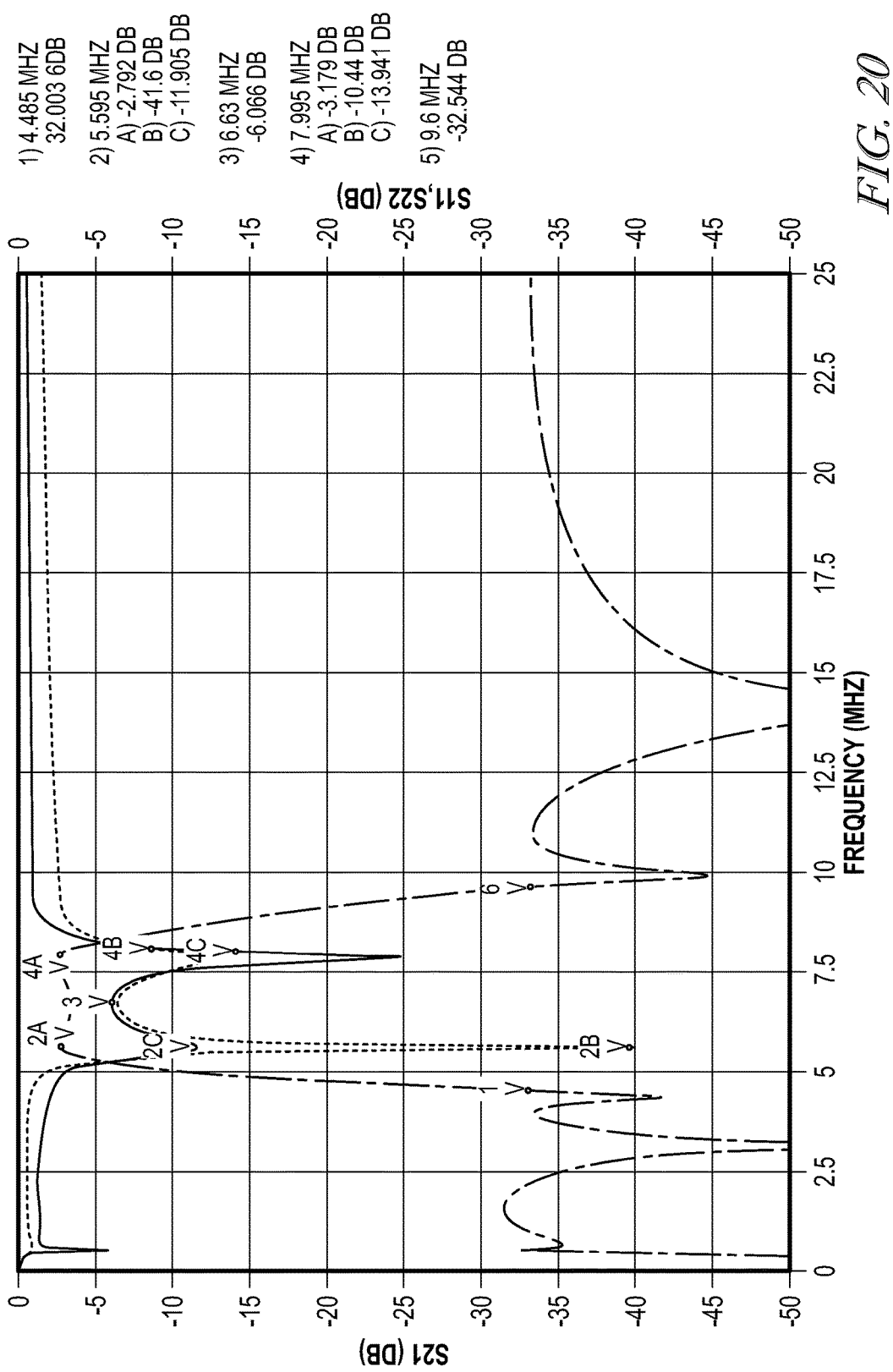

FIGS. 11-13 are timing diagrams illustrating digital waveforms received by the multi-tune filter system during varying commands, e.g., selection of the first and second customizable frequencies f1, f2. Tuning addresses start at 15 decimal (1.5 MHz) and end at 300 decimal (30 MHz) in 100 KHz increments for the low pass and high pass addresses. Tuning of the filter is initiated when a last data clock (32nd) pulse of the transmitted address is sent to the unit while a chip select line (CS) is held low.

FIG. 11 is a timing diagram illustrating digital waveforms received by the multi-tune filter system during a low pass address set command 140. In this example, address 15 is transmitted (i.e., shown in the first (or "low") byte "0000 1111") and corresponds to a frequency range bound of 1.5 MHz. The second byte (i.e., "0000 0000") indicates that the first byte sets the lower customizable frequency bound f1.

FIG. 12 is a timing diagram illustrating digital waveforms received by the multi-tune filter system during a high pass address set command 142. In this example, address 15 is transmitted (i.e., shown in the first byte "0000 1111") and corresponds to a frequency range bound of 1.5 MHz. The second byte (i.e., "1001 0000") indicates that the first byte sets the upper customizable frequency bound f2. As noted previously, in a working example combining the address timing of FIGS. 11 and 12, the second customizable frequency bound f2 must be greater than f1.

The low pass address set command 140 and the high pass address set command 142 will set the respective customizable frequency bounds f1, f2 when an address in the range of "0000 1111" to "1 0010 1100" (corresponding to 15-300 decimal, as noted hereinabove) is clocked into the multi-tune filter system 100. Tuning of the multi-tune filter system 100 may be performed in about 50 μs.

FIG. 13 is a timing diagram illustrating digital waveforms received by the multi-tune filter system during a read unit command 144. The read unit command timing is delivered for commands that read information stored within the memory 110 of the multi-tune filter system 100, including reading a unit identification, reading a unit firmware version, and reading a unit production date. The multi-tune filter system 100 remains at the previously tuned adjustable passband 104 when read unit command timing is received.

FIGS. 15-20 are exemplary frequency graphs of frequency ranges in which the multi-tune filter system operates. For example, in FIG. 15 the first customizable frequency bound f1 is set to 7.9 MHz and the second customizable frequency bound f2 is set to 15.4 MHz. Therefore, the adjustable passband 104 of the multi-tune filter system 100 spans 7.9-15.4 MHz. As illustrated in these examples, the adjustable passband 104 may be adjusted to allow differing frequency bands to pass and to allow the range of the passable band to increase or decrease. For example, FIG. 17 allows a relatively narrow range of frequencies to pass (i.e., 1.5 MHz to 1.8 MHz) while FIG. 16 allows a relatively broader range of frequencies to pass (i.e., 10.9 MHz to 21.5 MHz).

Figure 22:
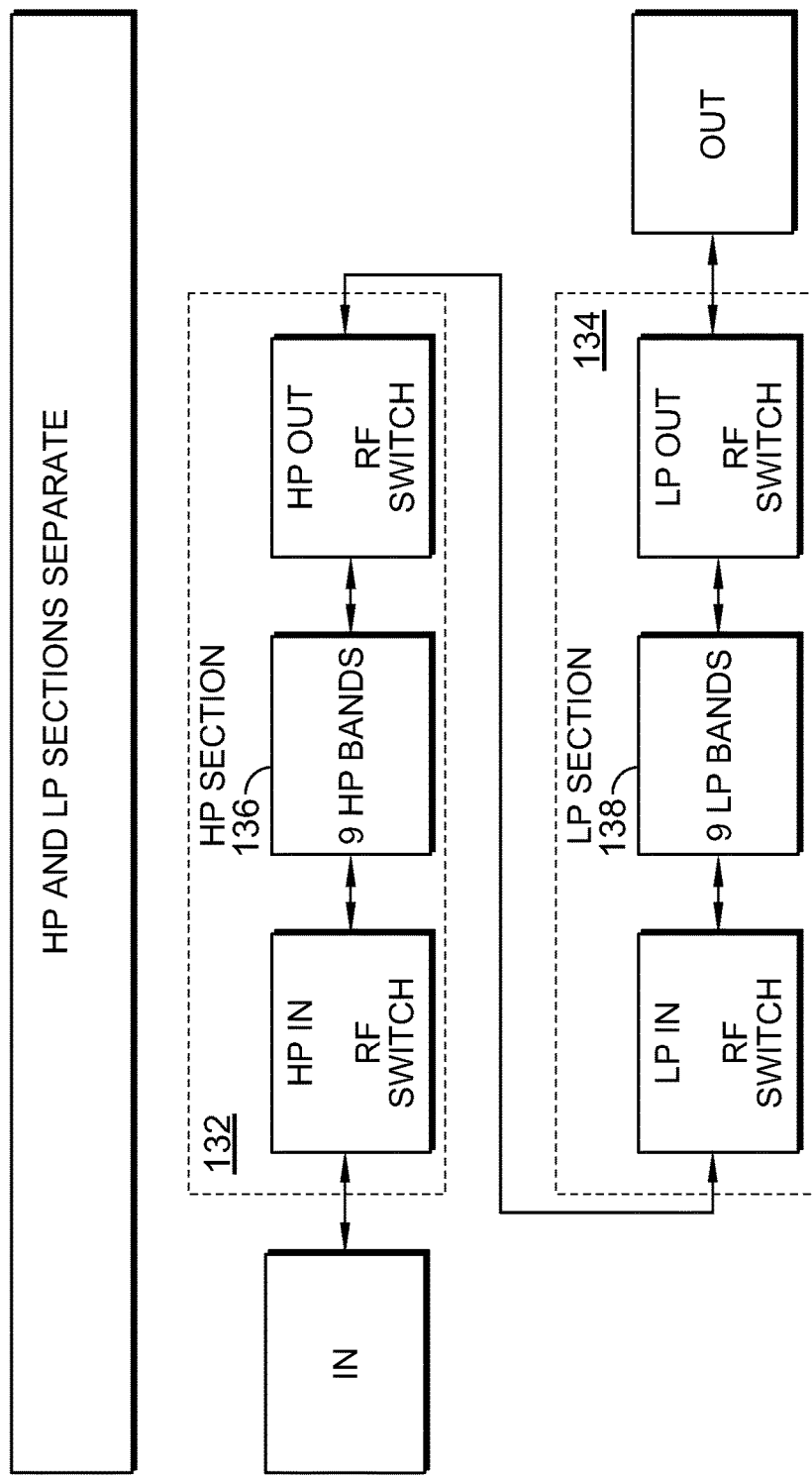
FIG. 22 is a block diagram illustrating interaction between the high pass filter array/section and the low pass filter array/section.

FIG. 21 is a block diagram illustrating an embodiment of the multi-tune filter system 100 including a high pass filter array/section 132 and a low pass filter array/section 134. FIG. 22 is a block diagram illustrating a flow through the high pass filter array/section and the low pass filter array/section. In this embodiment, a relatively large number of combinations of high pass filter subranges 136 and low pass filter subranges 138 (i.e., in the embodiment of FIG. 21 each filter array/section 132, 134 has nine filter subranges) may be executed. As a result, optimization of power reflected by each leg of the filter arrays/sections 132, 134 (i.e., return loss) is controlled at a system-wide level for desired operation. The cascade of the high pass and low pass filter arrays/sections 132, 134 at certain cutoff combinations may reach a −6.5 dB return loss. When frequencies of the adjustable passband 104 experience return loss above −9.5 dB, a 4.0 dB insertion loss is acceptable.

For the multi-tune filter system 100 shown and described with respect to FIGS. 1-5, a maximum passband insertion loss at ambient temperature is less than −4 dB. Furthermore, a passband return loss is between −6 dB and −10 dB.

Control Methods

Figure 23:
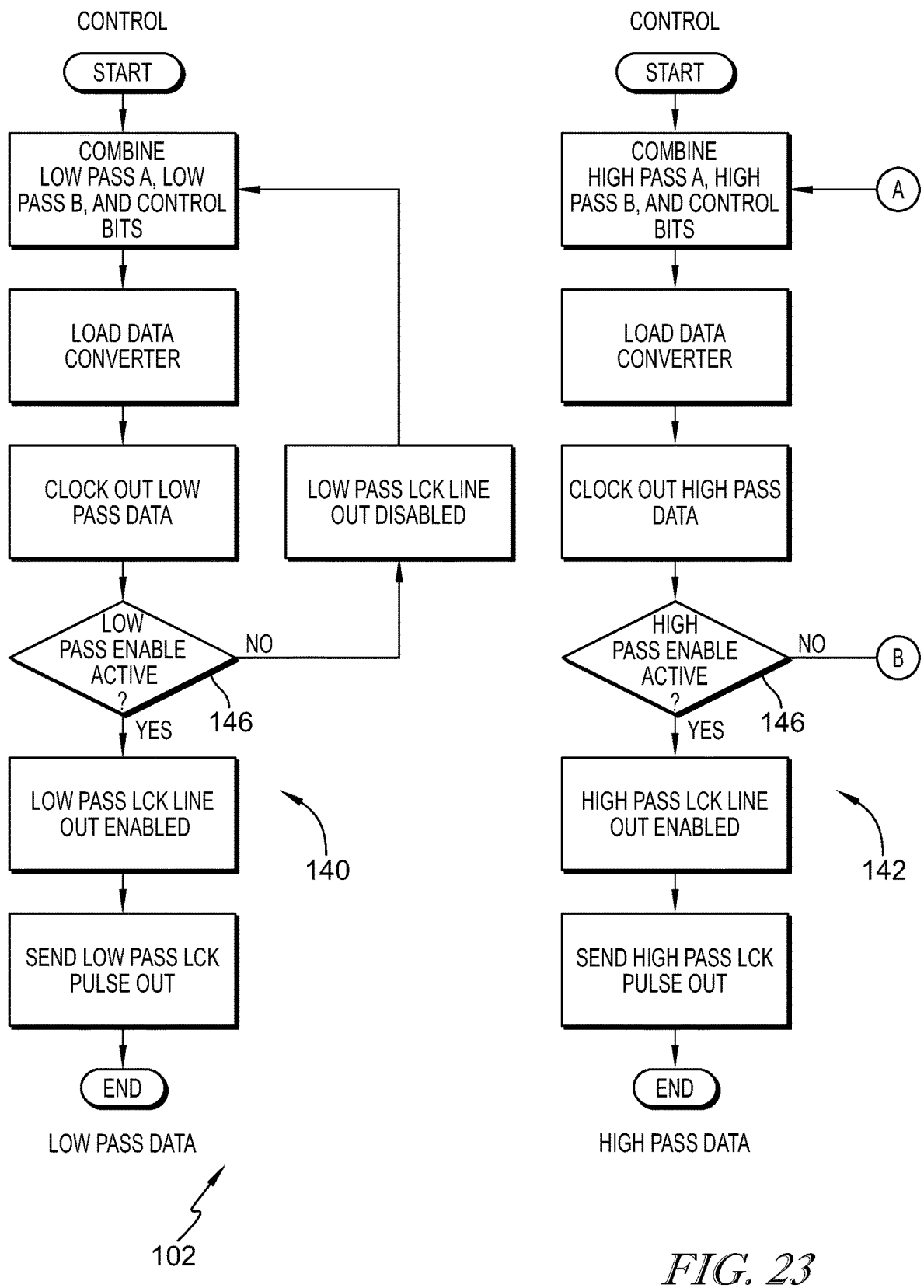
FIG. 23 is a flowchart illustrating data flows for the low pass address set command, high pass address set command, and the serial out command.
Figure 23:
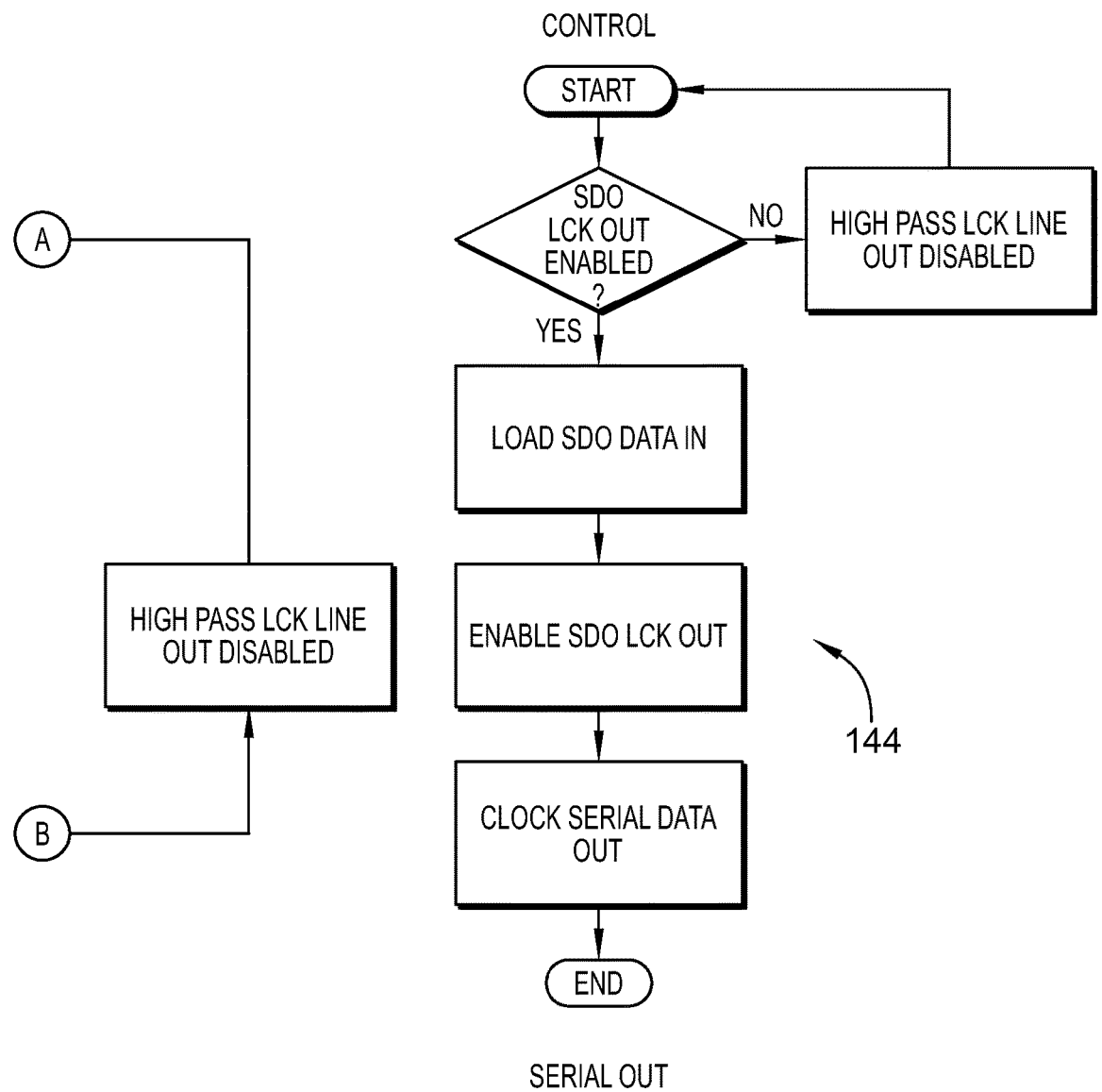

The control 102 for the multi-tune filter system 100 is shown and described with reference to FIGS. 23-27. FIG. 23 is a flowchart illustrating data flows for the low pass address set command 140, high pass address set command 142, and the serial out/read unit command 144. The low pass address set command 140 corresponds to the timing diagram of FIG. 11. The high pass address set command 142 corresponds to the timing diagram of FIG. 12. Also, the serial out command 144 corresponds to the read command timing diagram of FIG. 13. Together these three commands facilitate control of the multi-tune filter system 100. Furthermore, the low pass address set command 140 and the high pass address set command 142 operate to customize the adjustable passband 104 of the multi-tune filter system 100.

Figure 25:
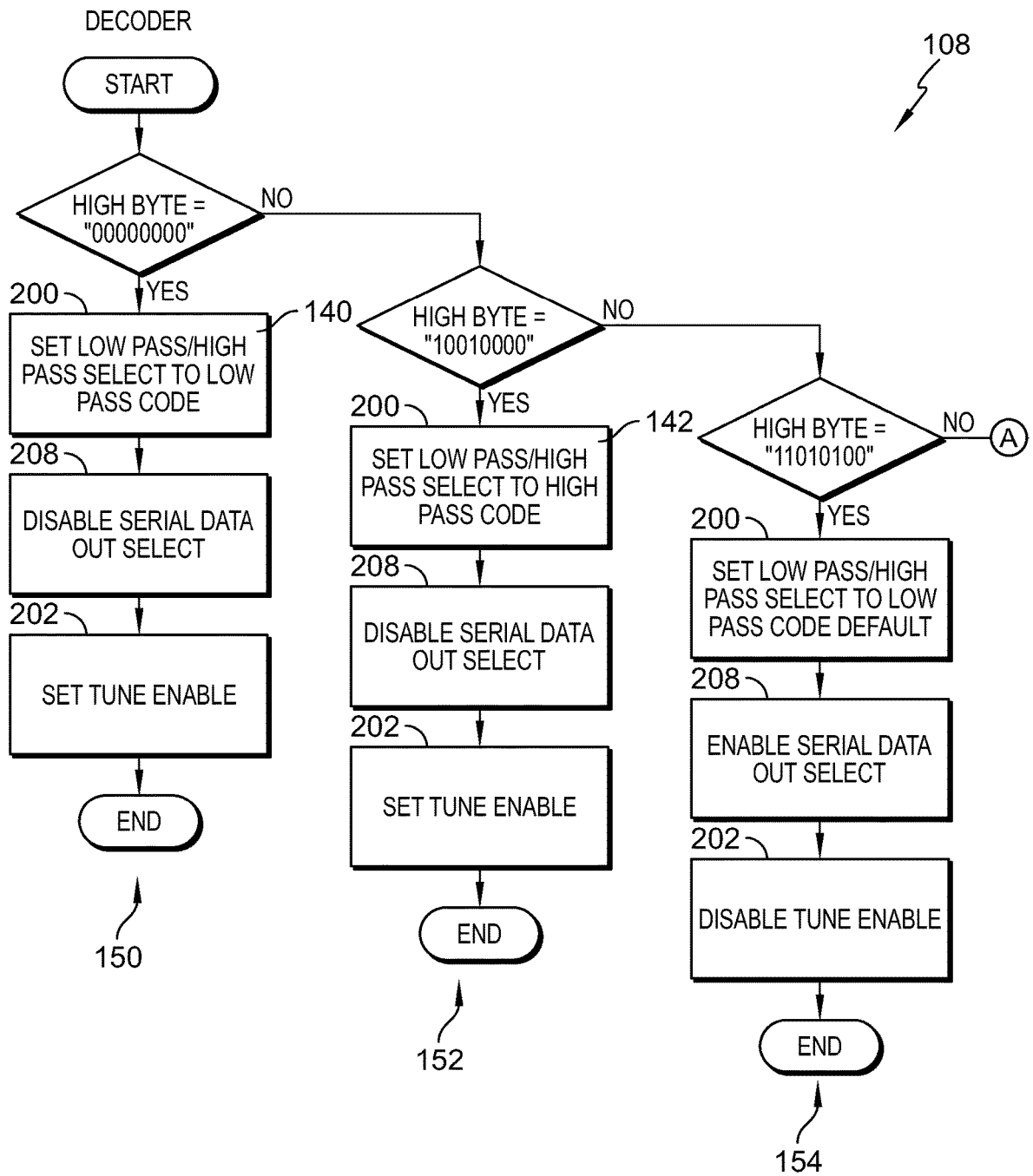
FIG. 25 is a flowchart illustrating data flows for a decoder of the multi-tune filter system.
Figure 25:
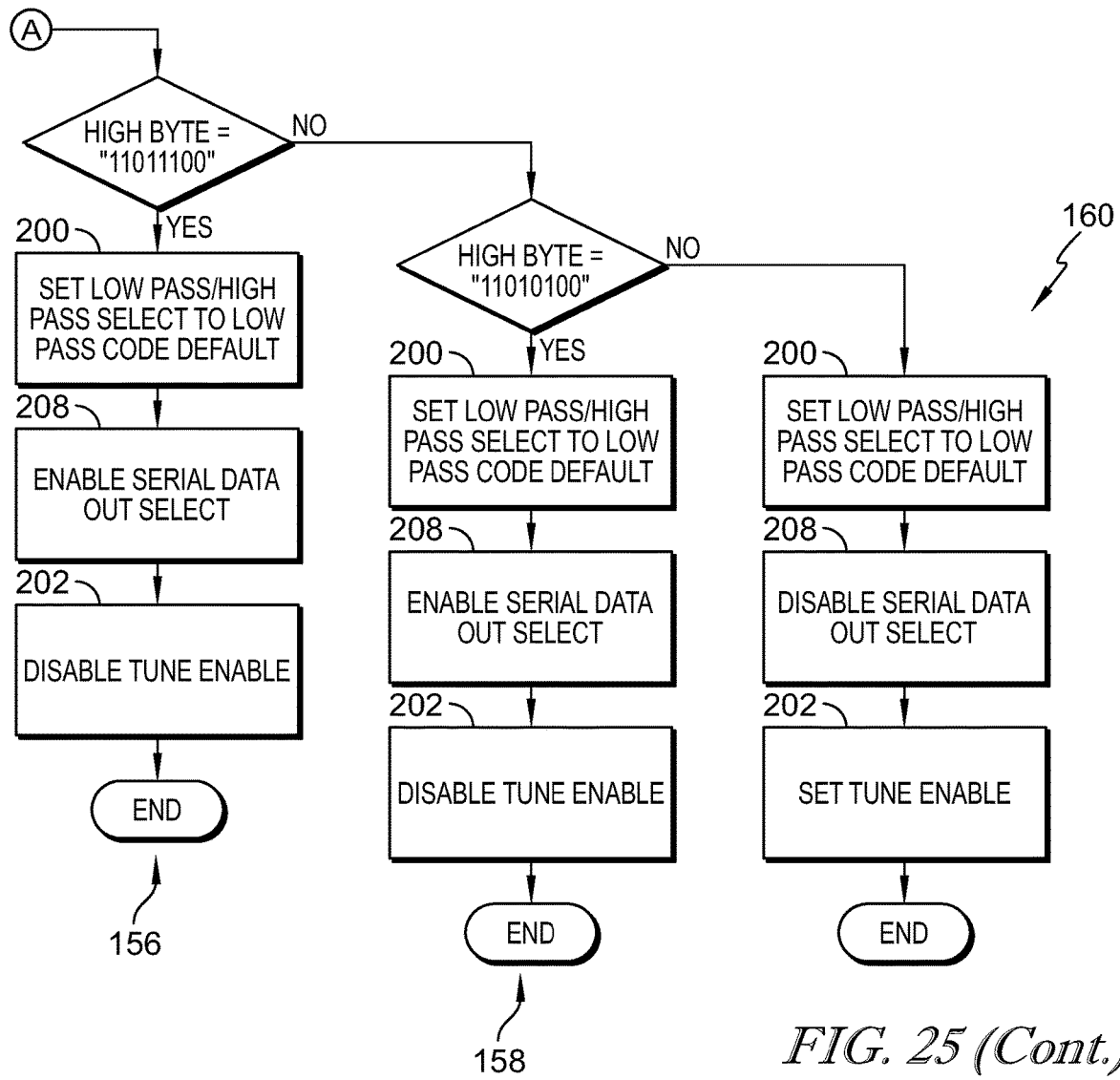

The low and high pass address set commands 140, 142 have corresponding enablement check steps 146 that check a setting of a tune enable status register 202 (refer ahead to FIG. 25). The tune enable status register 202 is checked to determine whether the customizable frequency bounds f1, f2 may be set by a received command.

Figure 24:
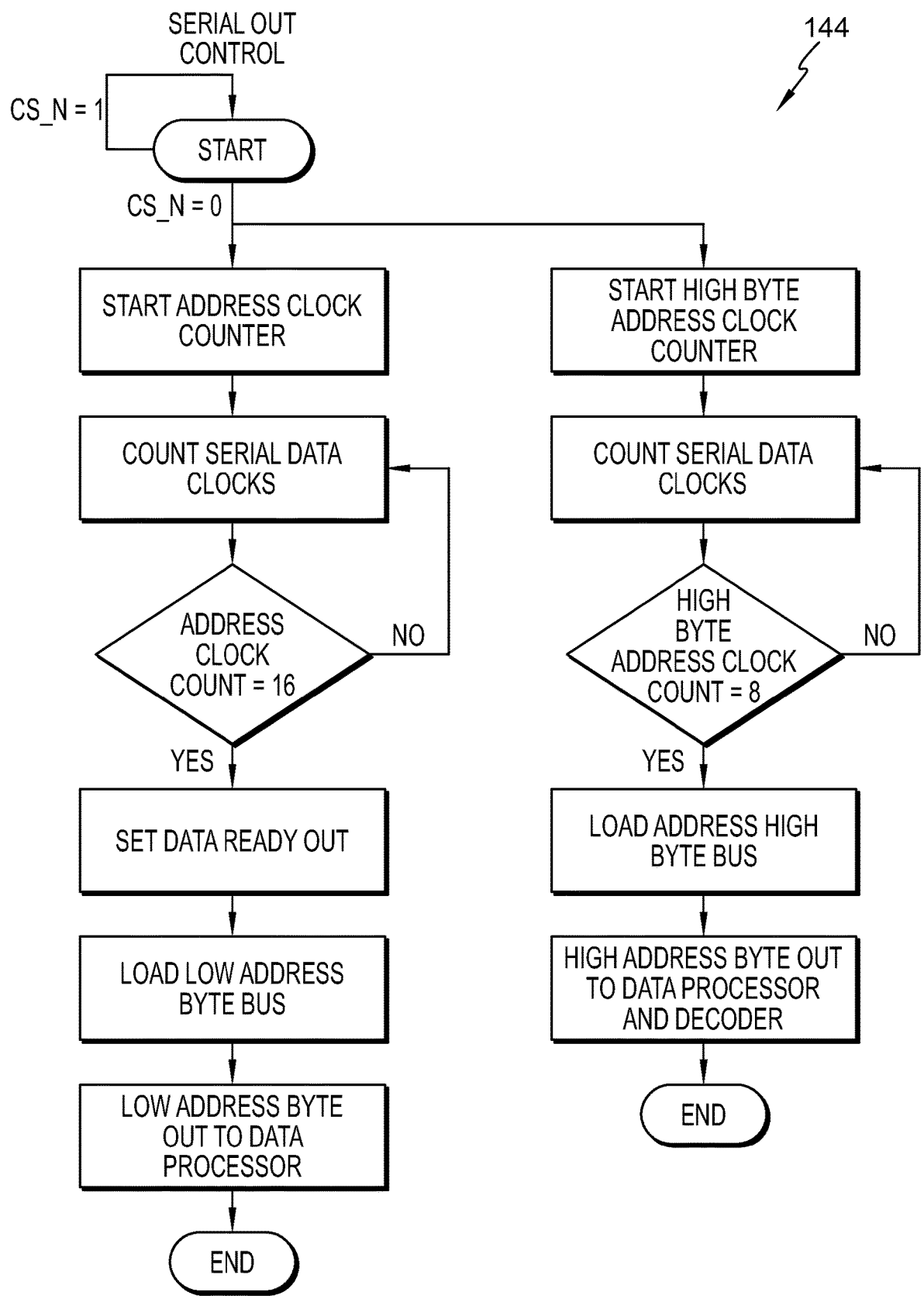
FIG. 24 is a flowchart illustrating additional data flows for read unit functions.

FIG. 24 is a flowchart illustrating additional data flows for the serial out command 144. Referring to FIG. 25, a flowchart illustrating data flows for a decoder 108 of the multi-tune filter system 100 is illustrated. The decoder 108 receives a high byte of the 16-bit words accepted by the multi-tune filter system 100. Along branch 150, the decoder 108 receives a request to execute the low pass address set command 140. Accordingly, a low pass status register 200 and the tune enable status register 202 are set to enable setting of the low pass customizable frequency bound f1.

Similarly, along branch 152, the decoder 108 receives a request to execute the high pass address set command 142. Accordingly, a high pass status register 206 and the tune enable status register 202 are set to enable setting of the high pass customizable frequency bound f2. In read unit, branches 154, 156, 158 the tune enable status register 202 is disabled to prevent setting of either of the customizable frequency bounds f1, f2. The read unit branches 154, 156, 158 perform one or more of variations on the serial out command 144 (see also FIGS. 23 and 24). In each of the read unit branches a serial out enable status register 208 is set to enable serial output of the multi-tune filter system 100. At default branch 160, if a 16-bit word is not recognized then a default command is performed that returns status registers to initialized settings. Initialized settings include disabling the serial out enable status register 208 and setting the tune enable status register 206 to enable tuning.

Figure 26:
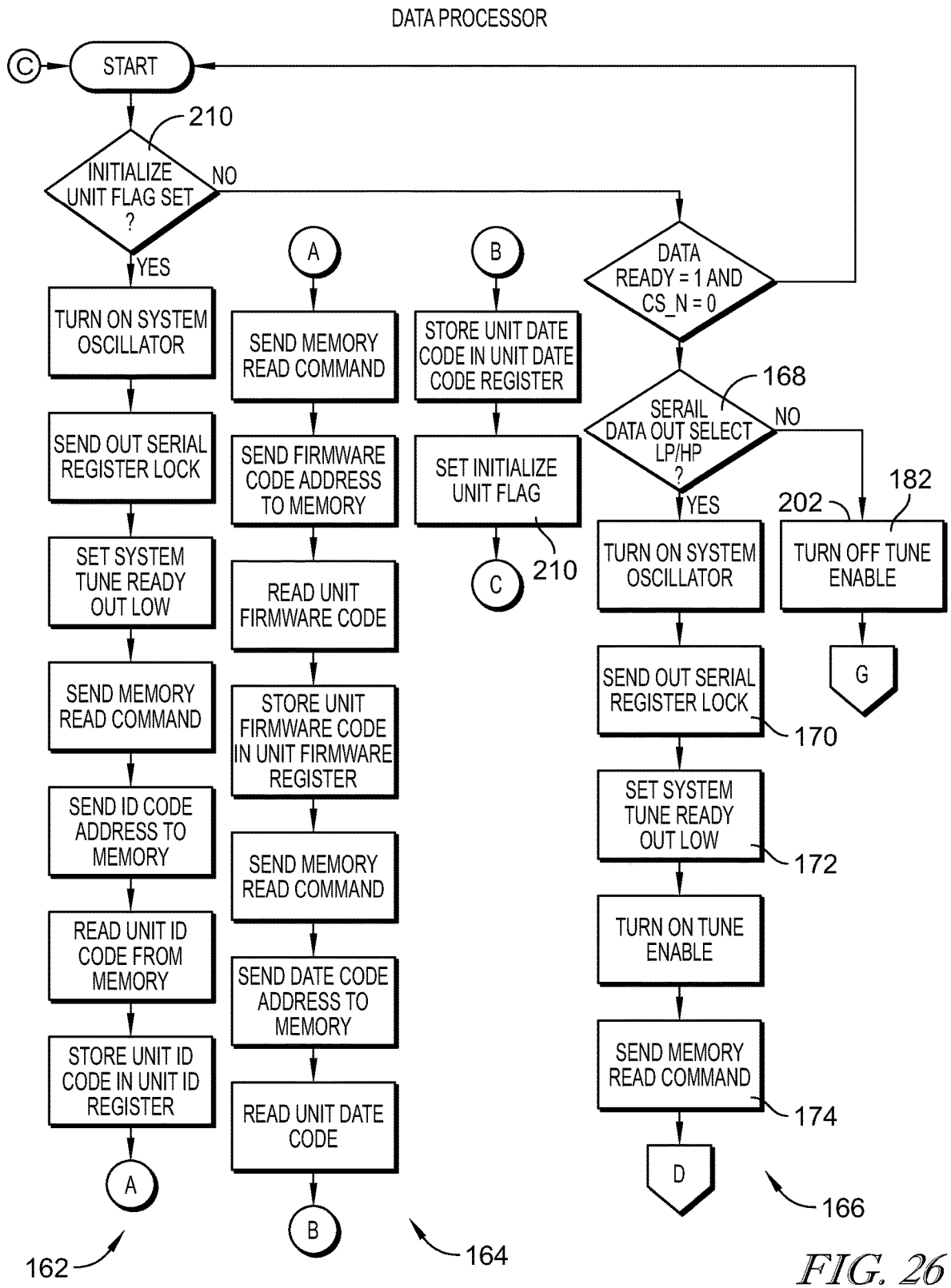
FIGS. 26 and 27 are a flowchart illustrating data flows for the data processor of the multi-tune filter system.
Figure 27:
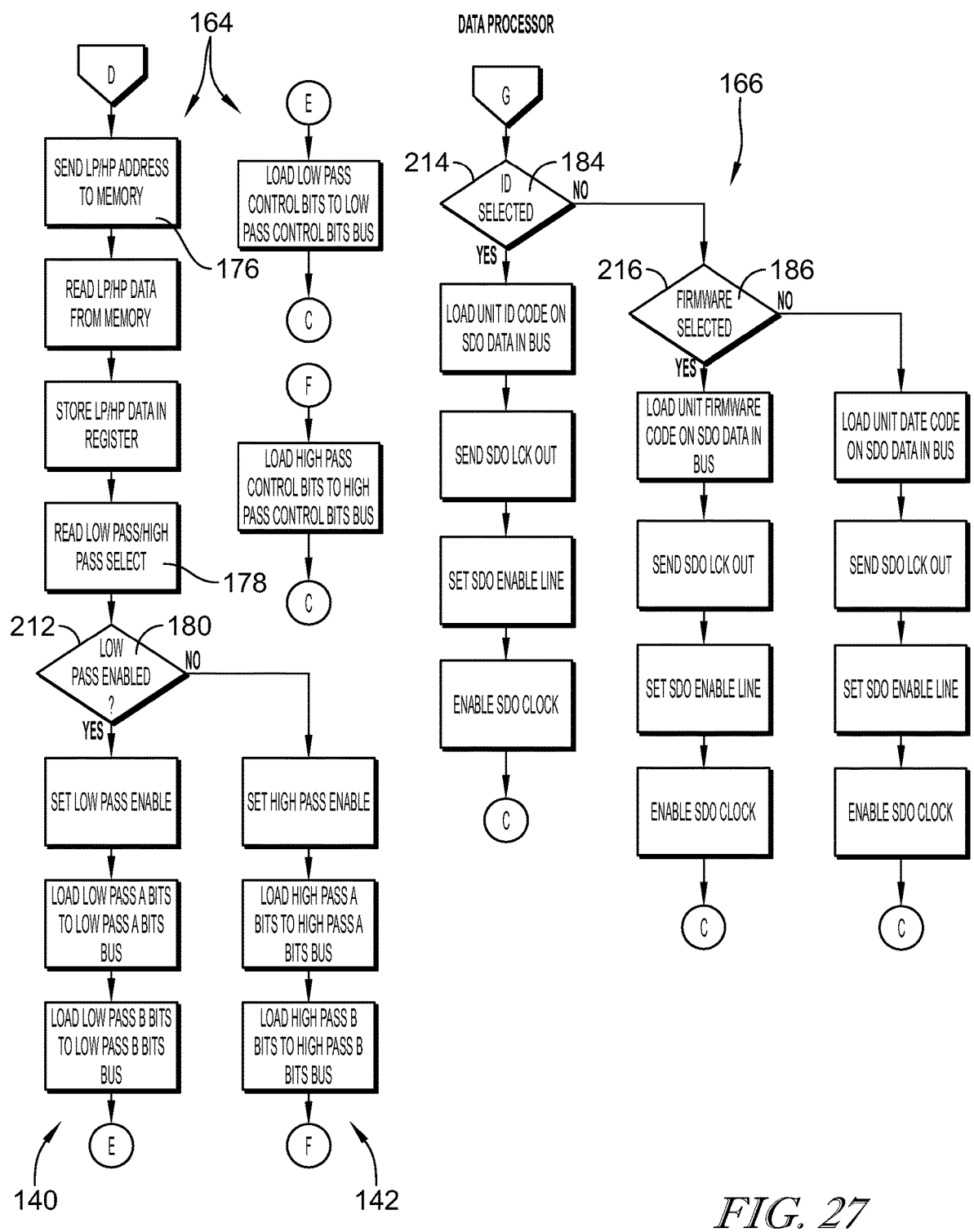

FIGS. 26 and 27 are a flowchart illustrating data flows for the data processor 106 of the multi-tune filter system 100. The data processor 106 accepts inputs from the serial data processor 118, the decoder 108, and a system clock. The data processor 106 also can access the memory module 110 via a memory control unit.

Referring now to FIGS. 26 and 27, the data processor 106 accepts inputs from user control (i.e., via the serial data processor 118) and develops control signals for the low pass control 112 and the high pass control 114 (see FIG. 3). As a result, the data processor 106 coordinates setting and maintaining the customizable frequency bounds f1, f2 that define the adjustable passband 104 and create a technical improvement within the field of filtering technology.

Control branch 162 (C-A-B-C) performs the steps for read unit functions (as further described with respect to FIGS. 23-25). An initialization control branch 164 is executed by the data processor 106 during initialization and ends by setting an initialize unit status register 210.

If initialization has already been performed then the data processor moves to control branches 164, 166, whereby the data processor 106 performs the low and high pass address set commands 140, 142 and the serial data out command 144, respectively. At decision block 168, the data processor 106 checks whether an incoming instruction is one of the low and high pass address set commands 140, 142 or the serial data out command 144.

The first control branch 164 (C-D-E-C or C-D-F-C) executes the low and high pass address set commands 140,

142. At step 170, a serial data out register is locked during first control branch 164. Then at step 172, a system tune ready initialization is set, followed by setting the tune enable status register 202 to "on" thereby preparing the multi-tune filter system 100 to receive a customizable frequency bound setting. At step 174, the data processor 106 sends a read command to memory control, and at step 176 an address within memory to be read is transmitted to the memory control. The memory control returns the contents of the memory location to a temporary storage register for storing the customizable frequency bound f1, f2 during either the low or high pass address set commands 140, 142. Step 178 detects a selection of which customizable frequency bound f1, f2 is being set.

At decision step 180 along the control branch 164, a low pass enable status register 212 is checked. Alternatively, a high pass enable status register could be checked; however, only one of the two status registers (i.e., low pass enable or high pass enable) need be checked to determine whether the command to be performed is the low pass address set command 140 or the high pass address set command 142. In the present example, if the low pass enable status register 212 is enabled ("YES") at the decision step 180, then the low pass command 140 is executed (D-E-C) to set the first customizable frequency bound f1. But, if the low pass enable status register 212 is not enabled ("NO") at the decision step 180, then the high pass command 142 is executed (D-F-C) to set the second customizable frequency bound f2.

The second control branch 166 (C-G-C) executes the serial data out command 144 and the read unit functions. First, at step 182, the tune enable status register 202 is disabled because during the serial data out command 144, bytes received from the serial data processor 118 are not stored as the customizable frequency bounds f1, f2. Instead, memory units accessed during execution of the second control branch 166 are only read and not written.

Referring again to FIG. 27, at decision step 184 an ID select status register 214 is polled. If the ID select status register 214 is enabled ("YES"), then identification information of the multi-tune filter system 100 is transmitted through the serial data out control 116 to identify the unit for a user. Further, at decision step 186, a firmware select status register is 216 is polled. If the firmware select status register 216 is enabled ("YES") then a current firmware version is read from memory and transmitted through the serial data out control 116. If neither of the ID select status register 214 and the firmware select status register 216 are enabled, then a build date of the multi-tune filter system 100 is transmitted through the serial data out control 116.

The status registers described hereinthroughout may instead be bits of an instruction received by the serial data processor 118. Received instructions may be temporarily, permanently, and/or semi-permanently stored in one or more volatile or non-volatile memory modules (e.g., random access memory (SRAM), flash memory, and electrically erasable programmable read-only memory (EEPROM)). The present disclosure contemplates that the control algorithm(s) 102 and the multi-tune filter system 100 may be integrated with an embedded microcontroller comprising one or more suitable processing modules and one or more memory modules (e.g., the processors 106, 118 and the memory 110) for storing the customizable frequency bounds f1, f2 and other parameters defining the adjustable passband 104. Also, in examples, one or more memory modules may instead be disposed remotely, such as in cloud storage and/or on a server, and accessible by the one or more processing modules through one or more wired and/or wireless connections. For example, the processors 106, 118 and the memory 110 may be configured as part of a communications device or as a separate control module associated only with the multi-tune filter 100. Also, example embodiments may integrate the processors, 106, 118, the memory 110, and the other control components as a single control module. Alternatively, these processing components may be separate, but communicatively coupled.

The embodiment(s) detailed hereinabove may be combined in full or in part, with any alternative embodiment(s) described.

INDUSTRIAL APPLICABILITY

The disclosed systems and methods can be implemented with an electronics system, using, for example, software, hardware (e.g., passive and/or active electronic components), and/or a combination of both, either with a dedicated microcontroller, integrated into another entity (e.g., communications device), or distributed across multiple entities. An exemplary system includes a bus or other communication mechanism for communicating information, and a processor coupled with the bus for processing information. The processor may be locally or remotely coupled with the bus. By way of example, the filter system may be implemented with one or more processors. The processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. The filter system also includes a memory, such as a Random-Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to a bus for storing information and instructions to be executed by processor.

According to one aspect of the present disclosure, the disclosed system can be implemented using a number of active and/or passive electronic components in response to a processor executing one or more sequences of one or more instructions contained in memory. Such instructions may be read into memory from another machine-readable medium, such as a data storage device. Execution of the sequences of instructions contained in main memory causes the processor to perform the process steps described herein. One or more processors in a multi-processing arrangement may also be employed to execute the sequences of instructions contained in memory. In alternative implementations, hard-wired circuitry may be used in place of or in combination with software instructions to implement various implementations of the present disclosure. Thus, implementations of the present disclosure are not limited to any specific combination of hardware circuitry and software. According to one aspect of the disclosure, the disclosed system can be implemented using one or many remote elements in an electronics system (e.g., cloud computing), such as a processor that is remote from other elements of the exemplary filter system described above.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Numerous modifications to the present disclosure will be apparent to those skilled in the art in view of the foregoing description. Preferred embodiments of this disclosure are described herein, including the best mode known to the inventors for carrying out the disclosure. It should be understood that the illustrated embodiments are exemplary only and should not be taken as limiting the scope of the disclosure.

What is claimed is:

1. A multi-tune filter system, the filter system having a digitally tunable frequency range filter having a filter topology comprising:
    a high-pass section with a first frequency with a digitally tuned high pass cutoff;
    a low-pass section with a second frequency with a digitally tuned low pass cutoff,
    wherein the first frequency is lower than the second frequency; and
    a third frequency greater than the first frequency and lesser than the second frequency,
    wherein each of the first frequency and the second frequency are selected from the range consisting of 1.5 MHz to 30 Mhz, and
    wherein the third frequency is equal to one half the sum of the first frequency and the second frequency, and
    the filter topology formed and further comprising an elliptic Cauer-Chebyshev topology for the high-pass section and a second elliptic Cauer-Chebyshev topology for the low-pass section that are implemented with a minimum of two capacitors in an array of digitally controlled capacitors,
    where the digitally tunable frequency range filter turns on or off the minimum of two capacitors in the array of digitally controlled capacitors to operably change the digitally tuned high pass cutoff of the first frequency and the digitally tuned high pass cutoff of the second frequency to digitally tune the multi-tune filter system between the first and second frequencies that form the digitally tunable frequency range filter.

2. The multi-tune filter system of claim 1, wherein the first, second, and third frequencies are switchable by digital activation to on or off status, the minimum of two capacitors in the capacitor array to cause an adjustment of the first, second and third frequencies in 100 KHz increments.

3. The multi-tune filter system of claim 1, wherein the filter topology further comprises a low pass filter topology and a high pass filter topology that in combination form the filter topology by digital activation to on or off status, the minimum of two capacitors in the capacitor array for each of the low pass and high pass filter topologies.

4. The multi-tune filter system of claim 3, wherein the low pass filter topology further comprises first, second, and third digital low pass filter legs.

5. The multi-tune filter system of claim 4, wherein the high pass filter topology further comprises first, second, and third digital high pass filter legs.

6. The multi-tune filter system of claim 5, wherein at least one of the first, second, and third digital low pass filter legs are switchable by digital activation to on or off status of the minimum of two capacitors in the capacitor array for the low pass filter topology and at least one of the first, second, and third, digital high pass filter legs are switchable by digital activation to on or off status the minimum of two capacitors in the capacitor array for the low pass filter topology and dependent on the third frequency to be independently tuned to discrete frequencies above and below the third frequency.

* * * * *